(12) United States Patent
Soneda et al.

(10) Patent No.: US 12,243,795 B2
(45) Date of Patent: Mar. 4, 2025

(54) SEMICONDUCTOR DEVICE

(71) Applicant: Mitsubishi Electric Corporation, Tokyo (JP)

(72) Inventors: Shinya Soneda, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 296 days.

(21) Appl. No.: 17/719,949

(22) Filed: Apr. 13, 2022

(65) Prior Publication Data

US 2023/0005809 A1 Jan. 5, 2023

(30) Foreign Application Priority Data

Jul. 5, 2021 (JP) .................. 2021-111362

(51) Int. Cl.
*H01L 27/06* (2006.01)
*H01L 23/34* (2006.01)
(Continued)

(52) U.S. Cl.
CPC .......... *H01L 23/34* (2013.01); *H01L 27/0664* (2013.01); *H01L 29/1095* (2013.01); *H01L 29/7397* (2013.01); *H01L 29/872* (2013.01)

(58) Field of Classification Search
CPC . H01L 23/34; H01L 27/0664; H01L 29/1095; H01L 29/7397; H01L 29/872; H01L 27/0629; H01L 29/0696; H01L 27/0727; H01L 29/0619; H01L 29/8611; H01L 29/0692; H01L 29/16; H01L 29/407; H01L 29/861; H01L 29/8613; H01L 29/7393; H01L 29/8725
See application file for complete search history.

(56) References Cited

U.S. PATENT DOCUMENTS

| 2004/0222430 A1 | 11/2004 | Necco et al. |
| 2009/0230500 A1 | 9/2009 | Yoshikawa et al. |

(Continued)

FOREIGN PATENT DOCUMENTS

| CN | 113035949 A | 6/2021 |
| JP | 2008-085199 A | 4/2008 |

(Continued)

OTHER PUBLICATIONS

An Office Action; "Notice of Reasons for Refusal," mailed by the Japanese Patent Office on May 28, 2024, which corresponds to Japanese Patent Application No. 2021-111362 and is related to U.S. Appl. No. 17/719,949; with English language translation.

(Continued)

*Primary Examiner* — Elias Ullah
(74) *Attorney, Agent, or Firm* — Studebaker & Brackett PC

(57) ABSTRACT

In a semiconductor device according to the technology disclosed in the present specification, a temperature detection region is provided with a diffusion layer of a second conductivity type provided on a surface layer of a drift layer of a first conductivity type, a well layer of a first conductivity type provided on a surface layer of the diffusion layer and electrically connected to an anode electrode, and a cathode layer of a first conductivity type provided on a surface layer of the well layer and electrically connected to a cathode electrode.

16 Claims, 19 Drawing Sheets

(51) Int. Cl.
*H01L 29/10* (2006.01)
*H01L 29/739* (2006.01)
*H01L 29/872* (2006.01)

(56) References Cited

U.S. PATENT DOCUMENTS

| | | |
|---|---|---|
| 2014/0001472 A1 | 1/2014 | Furukawa et al. |
| 2018/0269200 A1 | 9/2018 | Takahashi |
| 2018/0277437 A1 | 9/2018 | Yamada et al. |
| 2019/0081162 A1* | 3/2019 | Gejo .................. H01L 29/407 |
| 2020/0035819 A1 | 1/2020 | Naito |
| 2020/0144149 A1 | 5/2020 | Kubouchi et al. |
| 2021/0175229 A1 | 6/2021 | Takahashi |
| 2021/0265230 A1 | 8/2021 | Kubouchi et al. |
| 2022/0406770 A1 | 12/2022 | Takahashi |
| 2023/0317713 A1 | 10/2023 | Takahashi |
| 2024/0079286 A1 | 3/2024 | Kubouchi et al. |

FOREIGN PATENT DOCUMENTS

| | | |
|---|---|---|
| JP | 2009-188335 A | 8/2009 |
| JP | 2016-012647 A | 1/2016 |
| JP | 2020-077674 A | 5/2020 |
| WO | 2017/057358 A1 | 4/2017 |
| WO | 2017/208734 A1 | 12/2017 |

OTHER PUBLICATIONS

An Office Action; "Notice of Reasons for Refusal," mailed by the Japanese Patent Office on Sep. 10, 2024, which corresponds to Japanese Patent Application No. 2021-111362 and is related to U.S. Appl. No. 17/719,949; with English language translation.

Office Action issued in DE 10 2022 115 507.2; mailed by the German Patent and Trademark Office on Dec. 5, 2024.

An Office Action; "Decision of Refusal," mailed by the Japanese Patent Office on Jan. 28, 2025, which corresponds. To Japanese Patent Application No. 2021-111362 and is related to U.S. Appl. No. 17/719,949; with English language translation.

* cited by examiner

F I G. 8
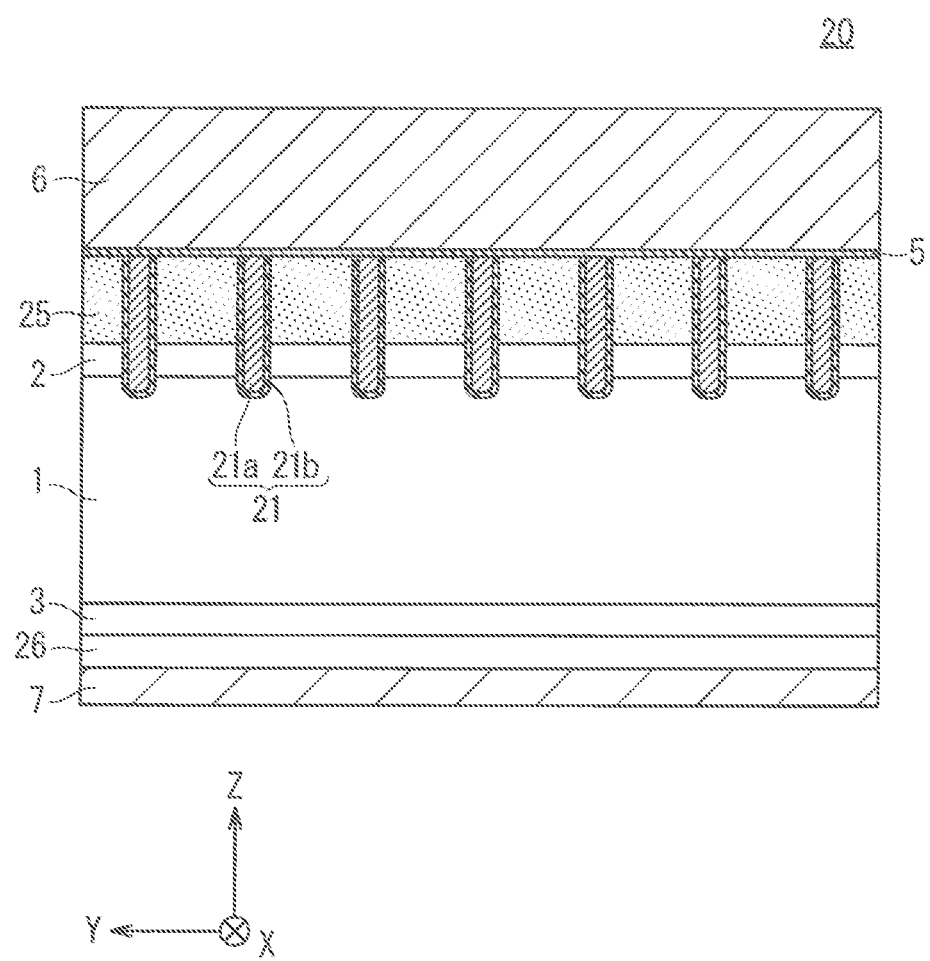

F I G. 1 2
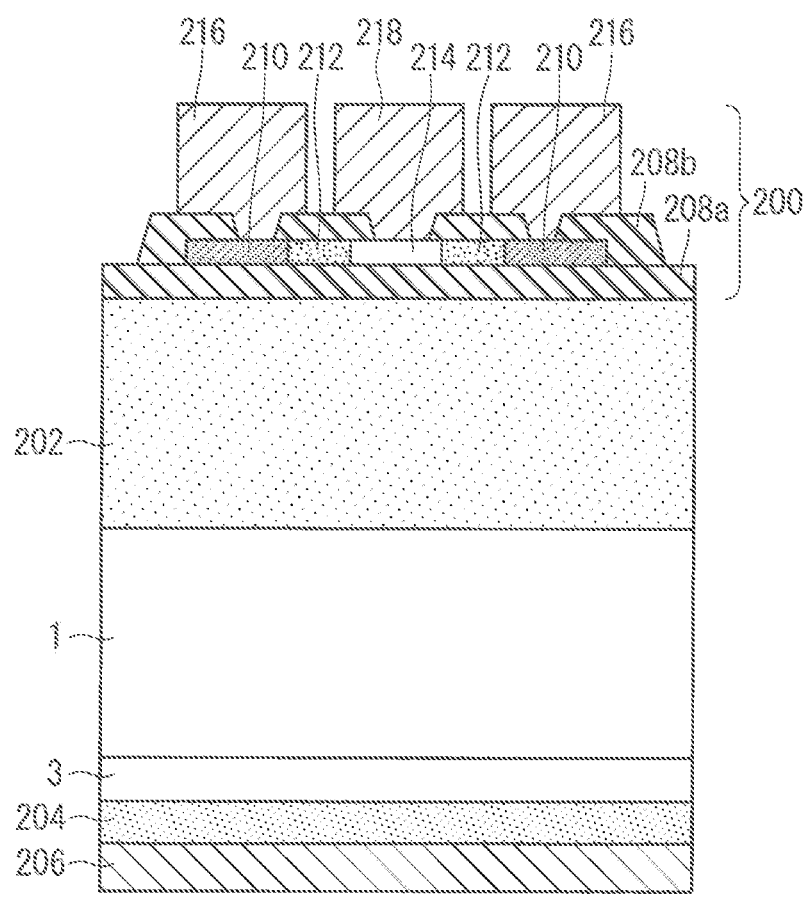

F I G. 15
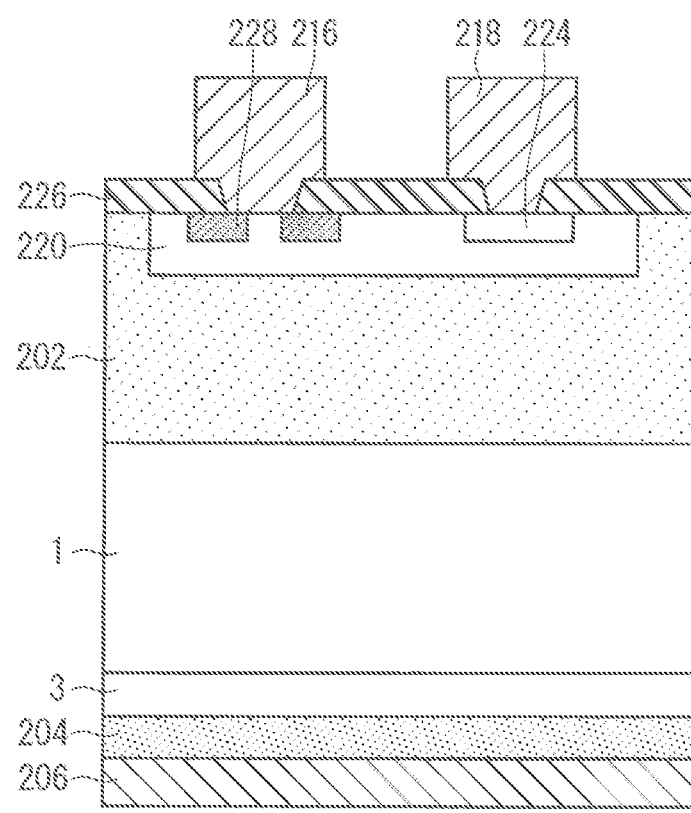

SEMICONDUCTOR DEVICE

BACKGROUND OF THE INVENTION

Field of the Invention

The technology disclosed in the present specification relates to a semiconductor device.

Description of the Background Art

Conventionally, there is a semiconductor device in which an insulated gate bipolar transistor (that is, an IGBT) region and a region where a diode for temperature detection (temperature sensing diode) is formed are provided on one semiconductor substrate.

In such a semiconductor device, there is a semiconductor device having a configuration in which a temperature sensing diode is formed in a Si substrate and capable of detecting a temperature in the Si substrate with high accuracy (see, for example, Japanese Patent Application Laid-Open No. 2009-188335).

In the semiconductor device having the above configuration, a parasitic bipolar transistor exists by forming a temperature sensing diode and a well layer that joins and isolates the temperature sensing diode and the Si substrate.

Therefore, since the temperature sensing diode and the parasitic bipolar transistor are connected in parallel and act, the characteristics of the temperature sensing diode may vary due to the influence of the parasitic bipolar transistor.

SUMMARY

The technology disclosed in the present specification is a technology for suppressing variations in characteristics of a temperature sensing diode.

A semiconductor device according to a first aspect of the technology disclosed in the present specification is a semiconductor device including a temperature detection region, a switching element region that at least partially surrounds the temperature detection region in plan view, and a signal pad region. The temperature detection region is provided with a diffusion layer of a second conductivity type provided on a surface layer of a drift layer of a first conductivity type, a well layer of a first conductivity type provided on a surface layer of the diffusion layer and electrically connected to an anode electrode, and a cathode layer of a first conductivity type provided on a surface layer of the well layer and electrically connected to a cathode electrode. The cathode layer has a higher impurity concentration than the well layer. The switching element region is provided with a base layer of a second conductivity type provided on a surface layer of a semiconductor layer of a first conductivity type, a source layer of a first conductivity type provided partially on a surface layer of the base layer, a plurality of trenches provided from an upper surface of the base layer to an inside of the semiconductor layer, and a gate electrode provided to be surrounded by a gate insulating film in the trench. The signal pad region is provided with an anode pad electrically connected to the anode electrode and a cathode pad electrically connected to the cathode electrode.

According to at least the first aspect of the technology disclosed in the present specification, by using a Schottky diode that performs unipolar operation as the temperature sensing diode, the operation of the parasitic bipolar transistor can be suppressed, and variations in characteristics of the temperature sensing diode can be suppressed.

Further, objects, features, aspects, and advantages relating to the technology disclosed in the present specification will be more apparent from the following detailed description and the accompanying drawings.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 7 and 8 are cross-sectional views each illustrating an example of the configuration of the diode region in the RC-IGBT;

FIGS. 12 and 13 are cross-sectional views each illustrating an example of a structure of a temperature sensing diode;

FIGS. 15 and 16 are cross-sectional views each illustrating an example of a configuration of a temperature sensing diode according to a preferred embodiment;

DESCRIPTION OF THE PREFERRED EMBODIMENTS

Figure 1:
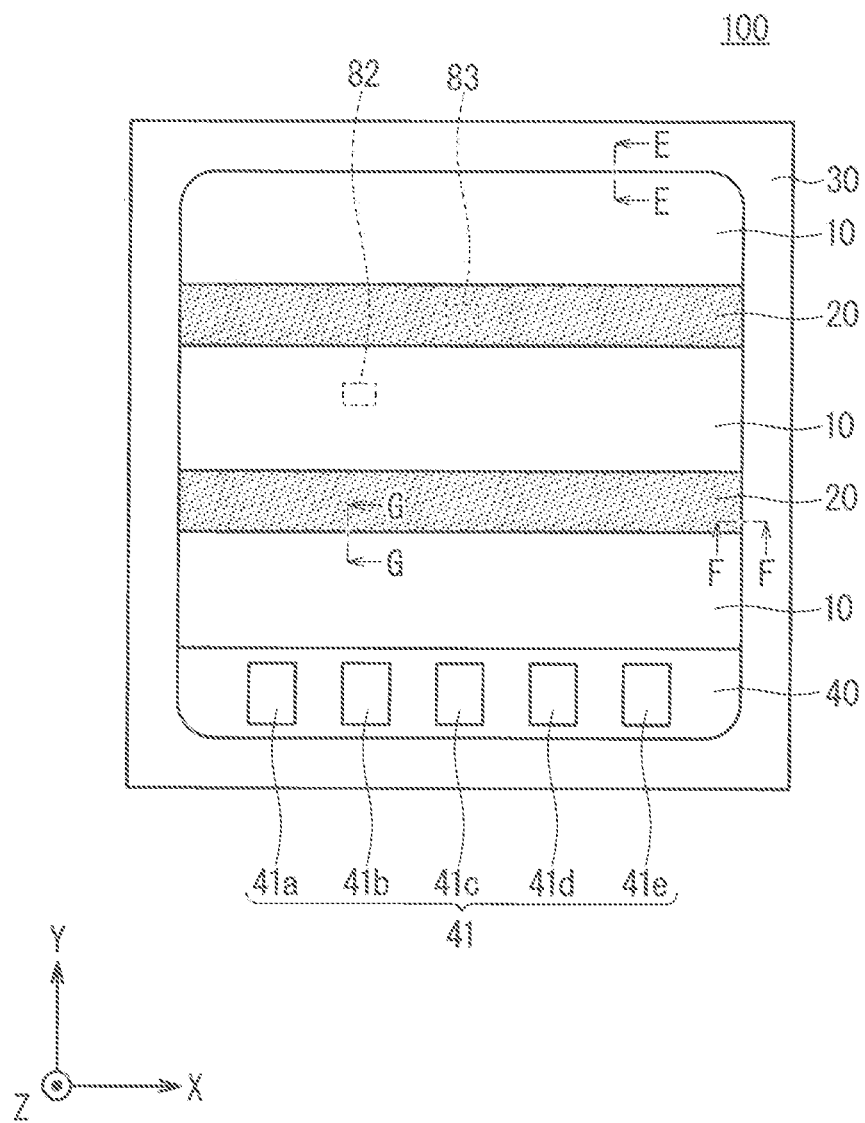
FIG. 1 is a plan view illustrating an example of a configuration of an RC-IGBT which is an example of a semiconductor device according to the preferred embodiment.

Hereinafter, preferred embodiments will be described with reference to the accompanying drawings. In the following preferred embodiments, detailed features and the like are also shown for the description of the technology, but they are merely examples, and not all of them are necessarily essential features for enabling the preferred embodiments to be carried out.

The drawings are schematically illustrated, and omission of a configuration, simplification of a configuration, or the like is appropriately made in the drawings for convenience of description. In addition, the mutual relationship of sizes and positions of configurations and the like illustrated in different drawings is not necessarily accurately described, and can be appropriately changed. In addition, hatching may be applied to a drawing such as a plan view that is not a cross-sectional view in order to facilitate understanding of the contents of the preferred embodiments.

Furthermore, in the following description, similar components are denoted by the same reference numerals, and names and functions thereof are also similar. Therefore, detailed description thereof may be omitted in order to avoid duplication.

In addition, in the description described in the present specification, when a certain component is described as "comprising", "including", "having", or the like, the expression is not an exclusive expression excluding the presence of other components unless otherwise specified.

In addition, in the description described in the present specification, even if ordinal numbers such as "first" or "second" are used, these terms are used for convenience to facilitate understanding of the contents of the preferred embodiments, and the contents of the preferred embodiments are not limited to the order or the like that can be caused by these ordinal numbers.

Furthermore, in the description described in the present specification, in the expression such as " . . . axis positive direction" or " . . . axis negative direction", a direction along the arrow of the illustrated . . . axis is a positive direction, and a direction opposite to the arrow of the illustrated . . . axis is a negative direction.

Furthermore, in the description described in the present specification, even if terms meaning specific positions or directions such as "upper", "lower". "left", "right", "side", "bottom", "front", or "back" are used, these terms are used for convenience to facilitate understanding of the contents of the preferred embodiments, and are not related to the positions or directions when the preferred embodiments are actually implemented.

Furthermore, in the description described in the present specification, the description of "the upper surface of . . . ", "the lower surface of . . . ", or the like includes a state in which another component is formed on the upper surface or the lower surface of the target component in addition to the upper surface itself or the lower surface itself of the target component. That is, for example, when it is described as "B provided on the upper surface of A", it does not prevent another component "C" from being interposed between A and B.

First Preferred Embodiment

Hereinafter, a semiconductor device according to the present preferred embodiment will be described.
<Configuration of Semiconductor Device>

In the following description, n and p represent the conductivity type of the semiconductor, and the first conductivity type is described as the n type and the second conductivity type is described as the p type. However, the first conductivity type may be the p type, and the second conductivity type may be the n type.

In addition, n− indicates that the impurity concentration is lower than n, and n+ indicates that the impurity concentration is higher than n. Similarly, p− indicates that the impurity concentration is lower than p, and p+ indicates that the impurity concentration is higher than p.

In addition, in the following description, a reverse conducting IGBT (that is, an RC-IGBT) is illustrated as an example, but an IGBT in which a diode region 20 to be described later is not provided may be used.

Figure 2:
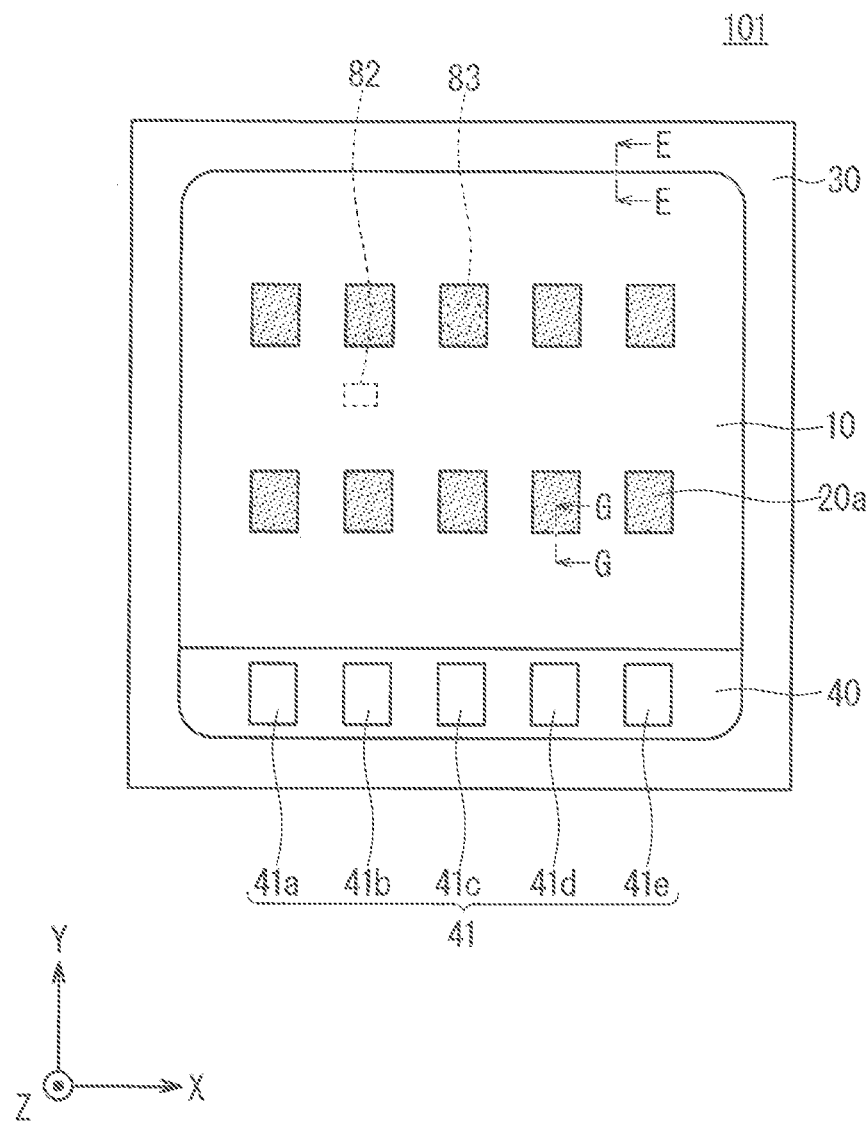
FIG. 2 is a plan view illustrating an example of an RC-IGBT having another configuration.

FIG. 1 is a plan view illustrating an example of a configuration of an RC-IGBT which is an example of a semiconductor device according to the present preferred embodiment. FIG. 2 is a plan view illustrating an example of an RC-IGBT having another configuration.

In a semiconductor device 100 illustrated in FIG. 1, IGBT regions 10 and the diode regions 20 are provided side by side in a stripe shape in plan view. This shape can also be said that the IGBT regions 10 and the diode regions 20 partially surround each other (sides on the positive Y-axis direction side and sides on the negative Y-axis direction side of the entire circumferences of the regions are surrounded so as to be sandwiched in the Y-axis direction). Hereinafter, such a configuration may be simply referred to as a "stripe type".

In a semiconductor device 101 illustrated in FIG. 2, a plurality of diode regions 20a are provided to be separated from each other in the longitudinal direction and the lateral direction, and an IGBT region 10 is provided around the diode regions 20a. Hereinafter, such a configuration may be simply referred to as an "island type".
<Overall Structure of Stripe Type>

In FIG. 1, in the semiconductor device 100, the IGBT regions 10 and the diode regions 20 are provided in one semiconductor device. The IGBT regions 10 and the diode regions 20 extend from one end side to the other end side of the semiconductor device 100. The IGBT regions 10 and the diode regions 20 are alternately provided in a stripe shape in a direction (Y-axis direction) orthogonal to the extending direction (X-axis direction) of the IGBT regions 10 and the diode regions 20.

In the configuration illustrated in FIG. 1, three IGBT regions 10 and the diode regions are illustrated, and all the diode regions 20 are sandwiched by the IGBT regions 10. However, the number of the IGBT regions 10 and the number of the diode regions 20 are not limited thereto, and for example, the number of the IGBT regions 10 may be three or more and three or less, and the number of the diode regions 20 may be two or more and two or less.

In addition, the places where the IGBT regions 10 are formed and the places where the diode regions 20 are formed in FIG. 1 may be interchanged, or all the IGBT regions 10 may be sandwiched by the diode regions 20.

In addition, the IGBT region 10 and the diode region 20 may be provided adjacent to each other one by one.

As illustrated in the example of FIG. 1, a signal pad region 40 is provided adjacent to the IGBT region 10 on the Y-axis negative direction side. The signal pad region 40 is a region where a control pad 41 for controlling the semiconductor device 100 is provided.

The IGBT regions 10 and the diode regions 20 are collectively referred to as a cell region. A termination region 30 is provided around a combined region of the cell region and the signal pad region 40 in order to maintain the withstand voltage of the semiconductor device 100.

A known withstand voltage holding structure can be appropriately selected and provided in the termination region 30. As the withstand voltage holding structure, for example, on the first main surface side which is the front surface side of the semiconductor device 100, a field limiting ring (that is, a FLR) which surrounds the cell region with a p type termination well layer which is a p type semiconductor, or a variation of lateral doping (VLD) which surrounds the cell region with a p type well layer to which a concentration gradient is applied may be provided. Here, the number of ring-shaped p type termination well layers used for a FLR or the concentration distribution used for a VLD may be appropriately selected according to the withstand voltage design of the semiconductor device 100. In addition, a p type termination well layer may be provided over substantially the entire region of the signal pad region 40, and an IGBT cell or a diode cell may be provided in the signal pad region 40.

The control pad 41 may be, for example, a current sense pad 41a, a Kelvin emitter pad 41b, a gate pad 41c, a temperature sensing diode pad 41d that is an anode pad, and a temperature sensing diode pad 41e that is a cathode pad.

The current sense pad 41a is a control pad for detecting a current flowing through the cell region of the semiconductor device 100, and is a control pad electrically connected to an IGBT cell or a diode cell in a part of the cell region so that a current of 1/several to several tens of thousands of times of the current flowing through the entire cell region flows when the current flows through the cell region of the semiconductor device 100.

The Kelvin emitter pad 41b and the gate pad 41c are control pads to which a gate drive voltage for controlling on/off of the semiconductor device 100 is applied. The Kelvin emitter pad 41b is electrically connected to a p type base layer of the IGBT cell, and the gate pad 41c is electrically connected to a gate trench electrode of the IGBT cell. The Kelvin emitter pad 41b and the p type base layer may be electrically connected via a p+ type contact layer.

The temperature sensing diode pad 41d and the temperature sensing diode pad 41e are control pads electrically connected to an anode electrode and a cathode electrode of a temperature sensing diode provided in the semiconductor device 100. The temperature sensing diode pad 41d and the temperature sensing diode pad 41e measure the temperature of the semiconductor device 100 by measuring the voltage between the anode electrode and the cathode electrode of the temperature sensing diode (not illustrated here) provided in the cell region.

Figure 18:
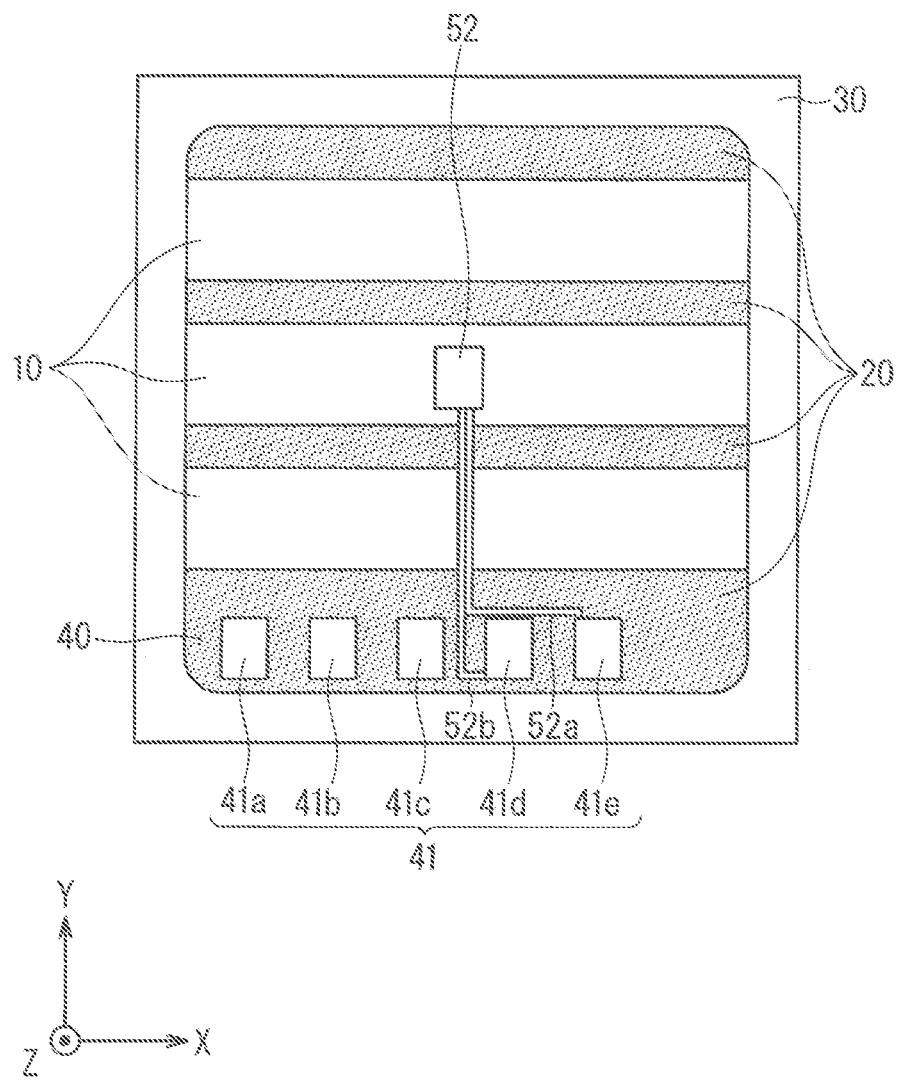
FIGS. 18 and 19 are plan views each illustrating an example of arrangement of the temperature sensing diode in the semiconductor device.
Figure 19:
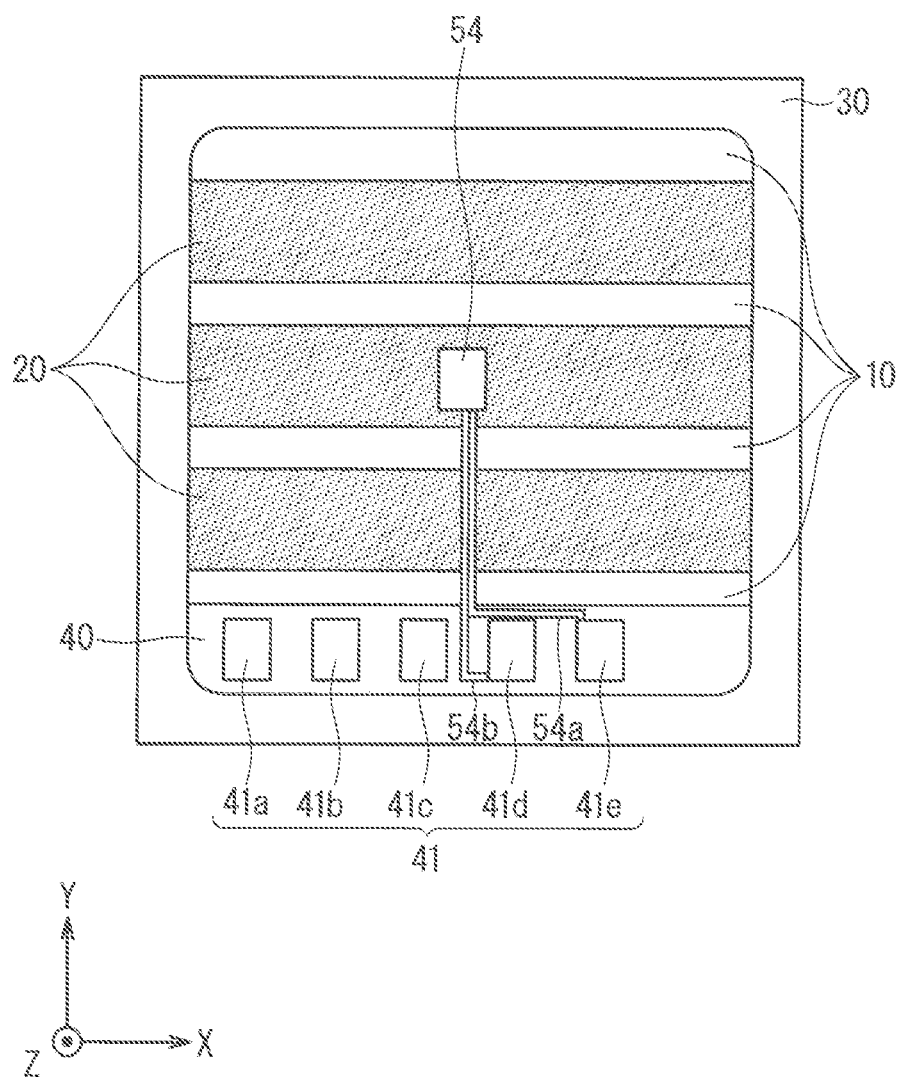

FIGS. 18 and 19 are plan views illustrating an example of arrangement of the temperature sensing diode in the semiconductor device 100. The temperature detection region in which the temperature sensing diode is provided is disposed at an arbitrary position inside the termination region in the chip.

As illustrated in the example of FIG. 18, a temperature sensing diode 52 includes a wire 52b connected to the temperature sensing diode pad 41d that is an anode pad, and a wire 52a connected to the temperature sensing diode pad 41e that is a cathode pad, and is disposed in a temperature detection region at a position surrounded by the IGBT region 10.

Furthermore, as illustrated in the example of FIG. 19, the temperature sensing diode 54 may include a wiring 54b connected to the temperature sensing diode pad 41d, and a wiring 54a connected to the temperature sensing diode pad 41e, and may be disposed in the temperature detection region at a position surrounded by the diode region 20.

<Overall Structure of Island Type>

In FIG. 2, in the semiconductor device 101, the IGBT region 10 and the diode regions 20a are provided in one semiconductor device. A plurality of diode regions 20a are arranged side by side in each of the longitudinal direction (Y-axis direction) and the lateral direction (X-axis direction) in the semiconductor device, and each diode region 20a is surrounded by the IGBT region 10. That is, the plurality of diode regions 20a are provided in an island shape in the IGBT region 10.

In FIG. 2, the diode regions 20a are provided in a matrix of four columns in the left-right direction (X-axis direction) in the drawing sheet and two rows in the up-down direction (Y-axis direction) in the drawing sheet. However, the number and arrangement of the diode regions 20a are not limited to these, and one or more diode regions 20a may be provided in the IGBT region 10 in an interspersed manner, and each diode region 20a may be surrounded by the IGBT region 10.

As illustrated in the example of FIG. 2, a signal pad region 40 is provided adjacent to the lower side (Y-axis negative direction side) of the IGBT region 10 in the drawing sheet. The signal pad region 40 is a region where a control pad 41 for controlling the semiconductor device 101 is provided.

The IGBT region 10 and the diode regions 20a are collectively referred to as a cell region. A termination region 30 is provided around a combined region of the cell region and the signal pad region 40 in order to maintain the withstand voltage of the semiconductor device 101.

A known withstand voltage holding structure can be appropriately selected and provided in the termination region 30. As the withstand voltage holding structure, for example, a FLR surrounding the combined region of the cell region and the signal pad region 40 with a p type termination well layer of a p type semiconductor or a VLD surrounding the cell region with a p type well layer with a concentration gradient may be provided on the first main surface side which is the front surface side of the semiconductor device 101. Here, the number of ring-shaped p type termination well layers used for a FLR or the concentration distribution used for a VLD may be appropriately selected according to the withstand voltage design of the semiconductor device 101. In addition, a p type termination well layer may be provided over substantially the entire region of the signal pad region 40, and an IGBT cell or a diode cell may be provided in the signal pad region 40.

The control pad 41 may be, for example, a current sense pad 41a, a Kelvin emitter pad 41b, a gate pad 41c, a temperature sensing diode pad 41d, and a temperature sensing diode pad 41c.

The current sense pad 41a is a control pad for detecting a current flowing through the cell region of the semiconductor device 101, and is a control pad electrically connected to an IGBT cell or a diode cell in a part of the cell region so that a current of 1/several to several tens of thousands of times of the current flowing through the entire cell region flows when the current flows through the cell region of the semiconductor device 101.

The Kelvin emitter pad 41b and the gate pad 41c are control pads to which a gate drive voltage for controlling on/off of the semiconductor device 101 is applied. The Kelvin emitter pad 41b is electrically connected to a p type base layer and an n+ type source layer of the IGBT cell, and the gate pad 41c is electrically connected to a gate trench electrode of the IGBT cell. The Kelvin emitter pad 41b and the p type base layer may be electrically connected via a p+ type contact layer.

The temperature sensing diode pad 41d and the temperature sensing diode pad 41e are control pads electrically connected to an anode electrode and a cathode electrode of a temperature sensing diode provided in the semiconductor device 101. The temperature sensing diode pad 41d and the temperature sensing diode pad 41e measure the temperature of the semiconductor device 101 by measuring the voltage between the anode and the cathode of the temperature sensing diode (not illustrated here) provided in the cell region.

The temperature sensing diode may be disposed in the signal pad region 40, or may be disposed at an arbitrary position inside the termination region in plan view using wiring. The temperature sensing diode may be disposed at a position surrounded by the IGBT region or may be disposed at a position surrounded by the diode regions.

<Structure of IGBT Region>

Figure 3:
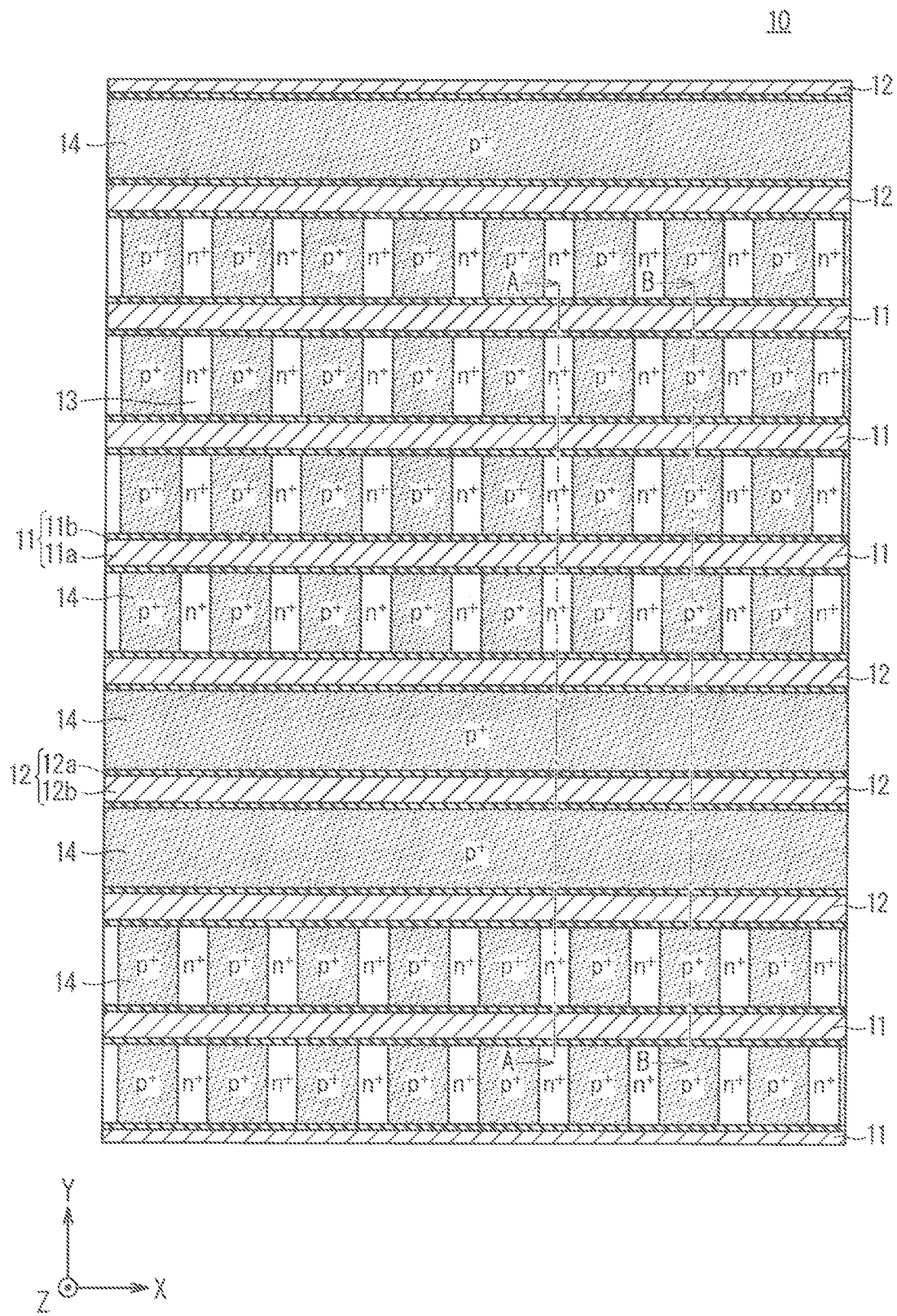
FIG. 3 is a plan view illustrating an example of a configuration of an IGBT region in the RC-IGBT.
Figure 4:
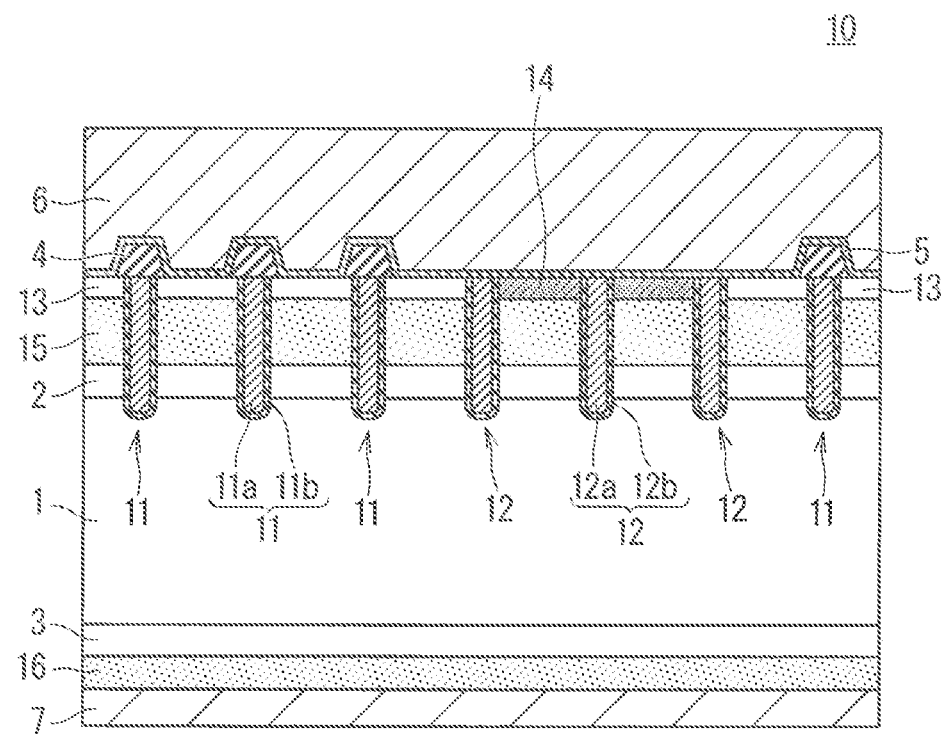
FIGS. 4 and 5 are cross-sectional views each illustrating an example of the configuration of the IGBT region in the RC-IGBT.
Figure 5:
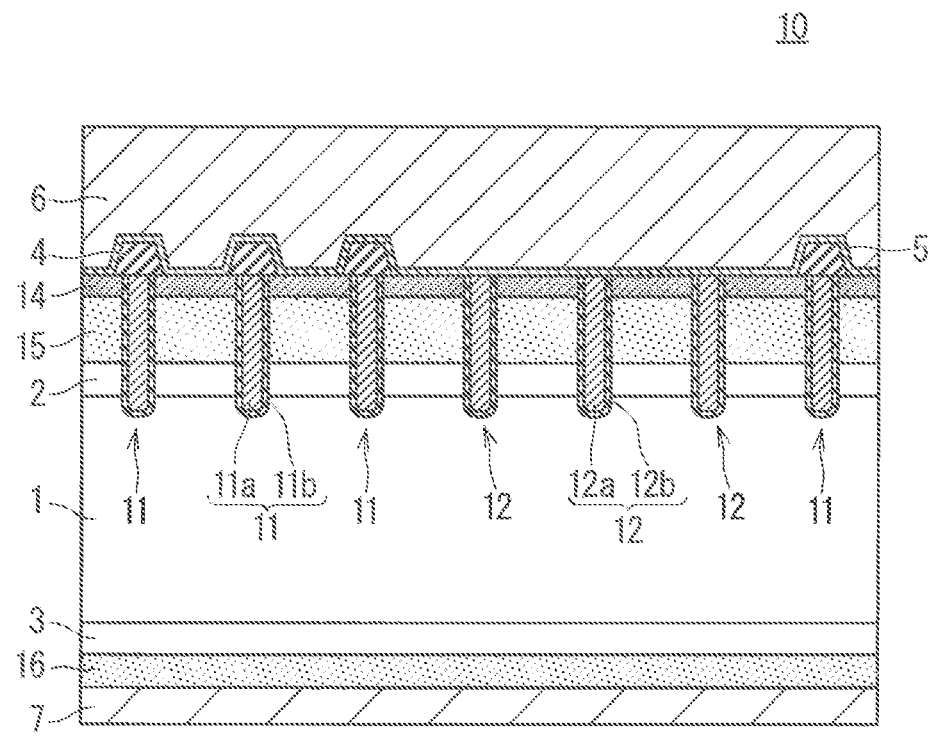

FIG. 3 is a plan view illustrating an example of a configuration of the IGBT region in the RC-IGBT. FIGS. 4 and 5 are cross-sectional views illustrating an example of the configuration of the IGBT region in the RC-IGBT.

FIG. 3 is a view illustrating a configuration of a region surrounded by a broken line 82 in the semiconductor device 100 illustrated in FIG. 1 or the semiconductor device 101 illustrated in FIG. 2.

FIG. 4 is a cross-sectional view corresponding to the A-A cross section of the configuration illustrated in FIG. 3, and FIG. 5 is a cross-sectional view corresponding to the B-B cross section of the configuration illustrated in FIG. 3.

As illustrated in the example of FIG. 3, in the IGBT region 10, active trench gates 11 and dummy trench gates 12 are provided in a stripe shape.

In the semiconductor device 100, the active trench gates 11 and the dummy trench gates 12 extend in the longitudinal direction (X-axis direction) of the IGBT region 10, and the longitudinal direction (X-axis direction) of the IGBT region 10 is the longitudinal direction of the active trench gates 11 and the dummy trench gates 12.

On the other hand, in the semiconductor device 101, the longitudinal direction and the lateral direction are not particularly distinguished from each other in the IGBT region 10, but the lateral direction (X-axis direction) in the drawing sheet may be the longitudinal direction of the active trench gates 11 and the dummy trench gates 12, and the vertical direction (Y-axis direction) in the drawing sheet may be the longitudinal direction of the active trench gates 11 and the dummy trench gates 12.

The active trench gate 11 is configured by providing an active trench electrode 11a in a trench formed in a semiconductor substrate via an active trench insulating film 11b.

The dummy trench gate 12 is configured by providing a dummy trench electrode 12a in the trench formed in the semiconductor substrate via a dummy trench insulating film 12b.

The active trench electrode 11a of the active trench gate 11 is electrically connected to the gate pad 41c. The dummy trench electrode 12a of the dummy trench gate 12 is electrically connected to an emitter electrode provided on the first main surface of the semiconductor device 100 or the semiconductor device 101.

An n+ type source layer 13 (also referred to as an n+-type emitter layer) is provided in contact with the active trench insulating films 11b on both sides in the width direction of the active trench gates 11. The n+ type source layer 13 is a semiconductor layer containing, for example, arsenic or phosphorus as an n type impurity. The concentration of the n type impurity is, for example, $1.0 \times 10^{17}/cm^3$ or more and $1.0 \times 10^{20}/cm^3$ or less. The n+ type source layer 13 is provided alternately with a p+ type contact layer 14 along the extending direction of the active trench gate 11.

The p+ type contact layer 14 is also provided between two adjacent dummy trench gates 12. The p+ type contact layer 14 is a semiconductor layer containing, for example, boron or aluminum as a p type impurity. The concentration of the p type impurity is, for example, $1.0 \times 10^{15}/cm^3$ or more and $1.0 \times 10^{20}/cm^3$ or less.

As illustrated in the example of FIG. 3, in the IGBT region 10 of the semiconductor device 100 or the semiconductor device 101, three active trench gates 11 and three dummy trench gates 12 are alternately arranged. That is, in the IGBT region 10, the set of active trench gates 11 and the set of dummy trench gates 12 are alternately arranged.

In FIG. 3, the number of active trench gates 11 included in one set of active trench gates 11 is three, but the number of active trench gates 11 may be one or more. In addition, the number of dummy trench gates 12 included in one set of dummy trench gates 12 may be one or more, and the number of dummy trench gates 12 may be zero. That is, all the trenches provided in the IGBT region 10 may be the active trench gates 11.

FIG. 4 is a cross-sectional view of the semiconductor device 100 or the semiconductor device 101 corresponding to the A-A cross section in FIG. 3, specifically, a cross-sectional view of the IGBT region 10.

The semiconductor device 100 or the semiconductor device 101 includes an n− type drift layer 1 made of a semiconductor substrate. The n− type drift layer 1 is a semiconductor layer containing, for example, arsenic or phosphorus as an n type impurity, and the concentration of the n type impurity is, for example, $1.0 \times 10^{12}/cm^3$ or more and $1.0 \times 10^{15}/cm^3$ or less.

In FIG. 4, the semiconductor substrate corresponds to a configuration in a range from the n+ type source layer 13 and the p+ type contact layer 14 to the p type collector layer 16.

In FIG. 4, the upper end (Z-axis positive direction side) of the n+ type source layer 13 and the p+ type contact layer 14 in the drawing sheet is referred to as the first main surface of the semiconductor substrate, and the lower end (Z-axis negative direction side) of the p type collector layer 16 in the drawing sheet is referred to as a second main surface of the semiconductor substrate. The first main surface of the semiconductor substrate is a main surface on the front surface side of the semiconductor device 100, and the second main surface of the semiconductor substrate is a main surface on the back surface side of the semiconductor device 100.

The semiconductor device 100 includes the n− type drift layer 1 between the first main surface and the second main surface opposed to the first main surface in the IGBT region 10 which is a cell region.

As illustrated in the example of FIG. 4, in the IGBT region 10, an n type carrier accumulation layer 2 having a higher n type impurity concentration than the n− type drift layer 1 is provided on the first main surface side of the n− type drift layer 1.

The n type carrier accumulation layer 2 is a semiconductor layer containing, for example, arsenic or phosphorus as an n type impurity, and the concentration of the n type impurity is, for example, $1.0 \times 10^{13}/cm^3$ or more and $1.0 \times 10^{17}/cm^3$ or less.

The semiconductor device 100 or the semiconductor device 101 may have a configuration in which the n− type drift layer 1 is also provided in the region of the n type carrier accumulation layer 2 illustrated in FIG. 4 without providing the n type carrier accumulation layer 2.

By providing the n type carrier accumulation layer 2, it is possible to reduce conduction loss when a current flows through the IGBT region 10.

The n type carrier accumulation layer 2 and the n− type drift layer 1 may be collectively referred to as a drift layer.

The n type carrier accumulation layer 2 is formed by ion-implanting an n type impurity into a semiconductor substrate constituting the n− type drift layer 1 and then diffusing the implanted n type impurity into the semiconductor substrate as the n− type drift layer 1 by annealing treatment.

A p type base layer 15 is provided on the surface layer on the first main surface side of the n type carrier accumulation layer 2. The p type base layer 15 is a semiconductor layer containing, for example, boron or aluminum as a p type impurity, and the concentration of the p type impurity is, for example, $1.0 \times 10^{12}/cm^3$ or more and $1.0 \times 10^{19}/cm^3$ or less. The p type base layer 15 is in contact with the active trench insulating films 11b of the active trench gates 11.

In the surface layer on the first main surface side of the p type base layer 15, the n+ type source layer 13 is provided in a region in contact with the active trench insulating films 11b of the active trench gates 11, and the p+ type contact layer 14 is provided in the remaining region (that is, a region not in contact with the active trench insulating films 11b).

The n+ type source layer 13 and the p+ type contact layer 14 constitute the first main surface of the semiconductor substrate. The p+ type contact layer 14 is a region having a higher concentration of the p type impurity than the p type base layer 15, and when it is necessary to distinguish the p+ type contact layer 14 and the p type base layer 15 from each other, they may be referred to individually, and the p+ type contact layer 14 and the p type base layer 15 may be collectively referred to as a p type base layer.

In the semiconductor device 100 or the semiconductor device 101, an n type buffer layer 3 having a higher n type impurity concentration than the n– type drift layer 1 is provided on the second main surface side of the n– type drift layer 1.

The n type buffer layer 3 is provided to suppress punch-through of a depletion layer extending from the p type base layer 15 to the second main surface side when the semiconductor device 100 is in an off state.

The n type buffer layer 3 may be formed by, for example, injecting phosphorus (P) or protons (H+), or may be formed by injecting both phosphorus (P) and protons (H+). The concentration of the n type impurity in the n type buffer layer 3 is, for example, $1.0 \times 10^{12}/cm^3$ or more and $1.0 \times 10^{18}/cm^3$ or less.

The semiconductor device 100 or the semiconductor device 101 may have a configuration in which the n– type drift layer 1 is also provided in the region of the n type buffer layer 3 illustrated in FIG. 4 without providing the n type buffer layer 3. The n type buffer layer 3 and the n– type drift layer 1 may be collectively referred to as a drift layer.

In the semiconductor device 100 or the semiconductor device 101, the p type collector layer 16 is provided on the second main surface side of the n type buffer layer 3. That is, the p type collector layer 16 is provided between the n– type drift layer 1 and the second main surface.

The p type collector layer 16 is a semiconductor layer containing, for example, boron or aluminum as a p type impurity, and the concentration of the p type impurity is, for example, $1.0 \times 10^{16}/cm^3$ or more and $1.0 \times 10^{20}/cm^3$ or less.

The p type collector layer 16 constitutes the second main surface of the semiconductor substrate. The p type collector layer 16 is provided not only in the IGBT region 10 but also in the termination region 30, and a portion of the p type collector layer 16 provided in the termination region 30 constitutes a p type termination collector layer 16a (described later). In addition, the p type collector layer 16 may be provided so as to partially protrude from the IGBT region 10 to the diode region 20.

As illustrated in the example of FIG. 4, in the semiconductor device 100 or the semiconductor device 101, trenches that penetrate the p type base layer 15 from the first main surface of the semiconductor substrate and reaches the n– type drift layer 1 are formed. The active trench electrode 11a is provided in the trench via the active trench insulating film 11b to form the active trench gate 11. The active trench electrode 11a faces the n– type drift layer 1 via the active trench insulating film 11b.

The dummy trench electrode 12a is provided in the trench via the dummy trench insulating film 12b to form the dummy trench gate 12. The dummy trench electrode 12a faces the n– type drift layer 1 via the dummy trench insulating film 12b.

The active trench insulating film 11b of the active trench gate 11 is in contact with the p type base layer 15 and the n+ type source layer 13. When a gate drive voltage is applied to the active trench electrode 11a, a channel is formed in the p type base layer 15 in contact with the active trench insulating film 11b of the active trench gate 11.

As illustrated in the example of FIG. 4, an interlayer insulating film 4 is provided on the upper surfaces of the active trench electrodes 11a of the active trench gates 11. A barrier metal 5 is formed on an upper surface of a region of the first main surface of the semiconductor substrate where the interlayer insulating film 4 is not provided and an upper surface of the interlayer insulating film 4.

The barrier metal 5 may be, for example, a conductor containing titanium (Ti), for example, titanium nitride, or TiSi obtained by alloying titanium and silicon (Si). As illustrated in the example of FIG. 4, the barrier metal 5 is in ohmic contact with the n+ type source layer 13, the p+ type contact layer 14, and the dummy trench electrodes 12a, and is electrically connected to the n+ type source layer 13, the p+ type contact layer 14, and the dummy trench electrodes 12a. An emitter electrode 6 is provided on the upper surface of the barrier metal 5.

The emitter electrode 6 may be formed of, for example, an aluminum alloy such as an aluminum silicon alloy (Al—Si-based alloy), or may be an electrode including a plurality of layers of metal films in which a plating film is formed by electroless plating or electrolytic plating on an electrode formed of an aluminum alloy. The plating film formed by electroless plating or electrolytic plating may be, for example, a nickel (Ni) plating film.

In addition, in a case where there is a fine region between adjacent interlayer insulating films 4 or the like, in which favorable embedding cannot be obtained by the emitter electrode 6, tungsten having better embeddability than the emitter electrode 6 may be arranged in the fine region, and the emitter electrode 6 may be provided on the upper surface of the tungsten.

The emitter electrode 6 may be provided on the upper surfaces of the n+ type source layer 13, the p+ type contact layer 14, and the dummy trench electrodes 12a without providing the barrier metal 5. Alternatively, the barrier metal 5 may be provided only on the upper surface of an n type semiconductor layer such as the n+ type source layer 13. The barrier metal 5 and the emitter electrode 6 may be collectively referred to as an emitter electrode.

In FIG. 4, the interlayer insulating film 4 is not provided on the upper surfaces of the dummy trench electrodes 12a of the dummy trench gates 12, but the interlayer insulating film 4 may be formed on the upper surfaces of the dummy trench electrodes 12a of the dummy trench gates 12. When the interlayer insulating film 4 is formed on the upper surfaces of the dummy trench electrodes 12a of the dummy trench gates 12, the emitter electrode 6 and the dummy trench electrodes 12a may be electrically connected in another cross section.

A collector electrode 7 is provided on the second main surface side of the p type collector layer 16. Similarly to the emitter electrode 6, the collector electrode 7 may be made of an aluminum alloy or an aluminum alloy and a plating film. The collector electrode 7 may have a configuration different from that of the emitter electrode 6. The collector electrode 7 is in ohmic contact with the p type collector layer 16 and is electrically connected to the p type collector layer 16.

FIG. 5 is a cross-sectional view of the semiconductor device 100 or the semiconductor device 101 corresponding to the B-B cross section in FIG. 3, specifically, a cross-sectional view of the IGBT region 10.

The cross-sectional view corresponding to the B-B cross section illustrated in FIG. 5 is different from the cross-sectional view corresponding to the A-A cross section illustrated in FIG. 4 in that the n+ type source layers 13 provided on the first main surface side of the semiconductor substrate while being in contact with the active trench gate 11 are not seen. That is, as shown in the example in FIG. 4, the n+ type source layers 13 are selectively provided on the first main surface side of the p type base layer. The p type base layer referred to herein is a p type base layer in which the p type base layer 15 and the p+ type contact layer 14 are collectively referred to.

<Structure of Diode Region>

Figure 6:
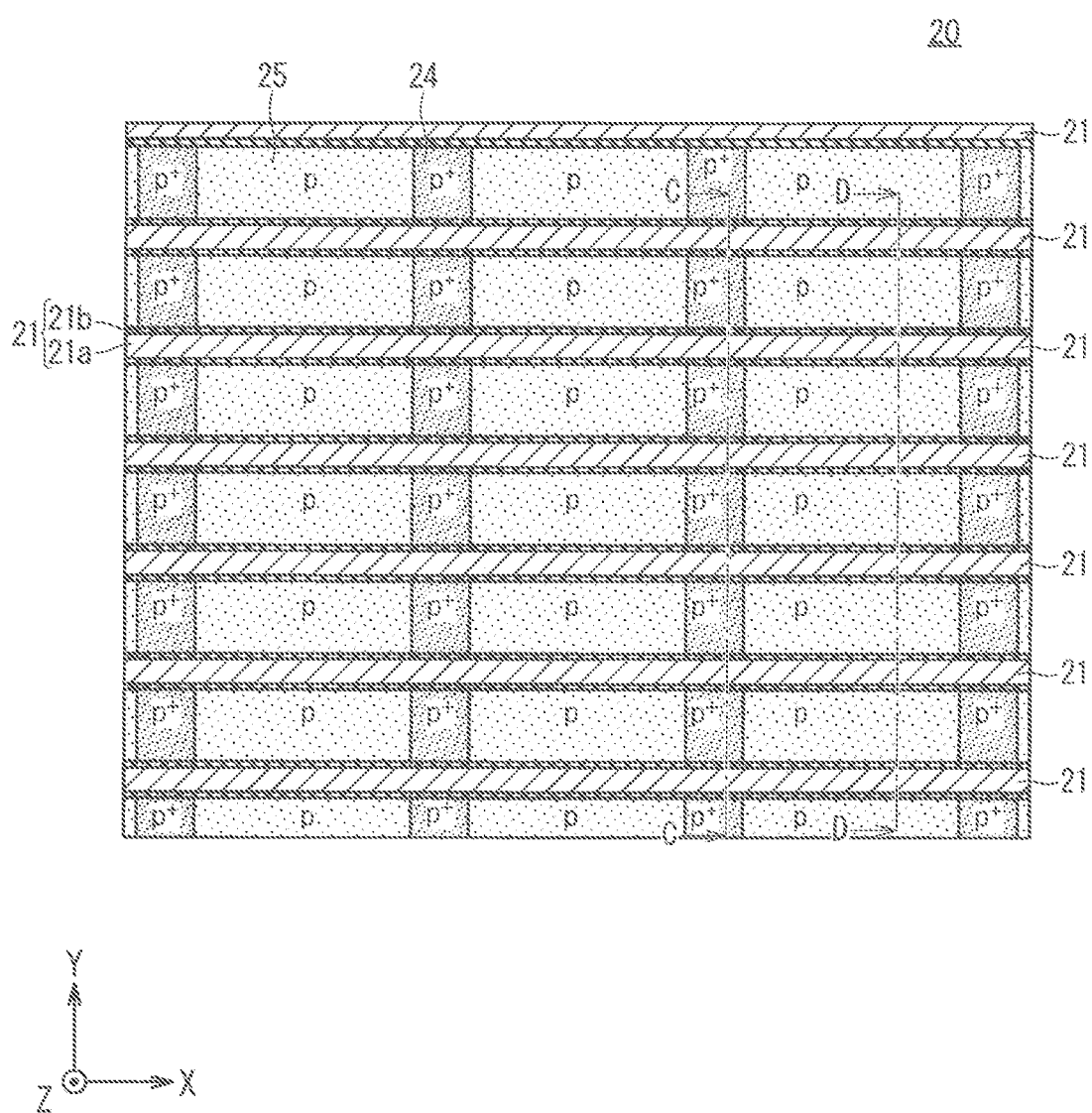
FIG. 6 is a plan view illustrating an example of a configuration of the diode region in the RC-IGBT.
Figure 7:
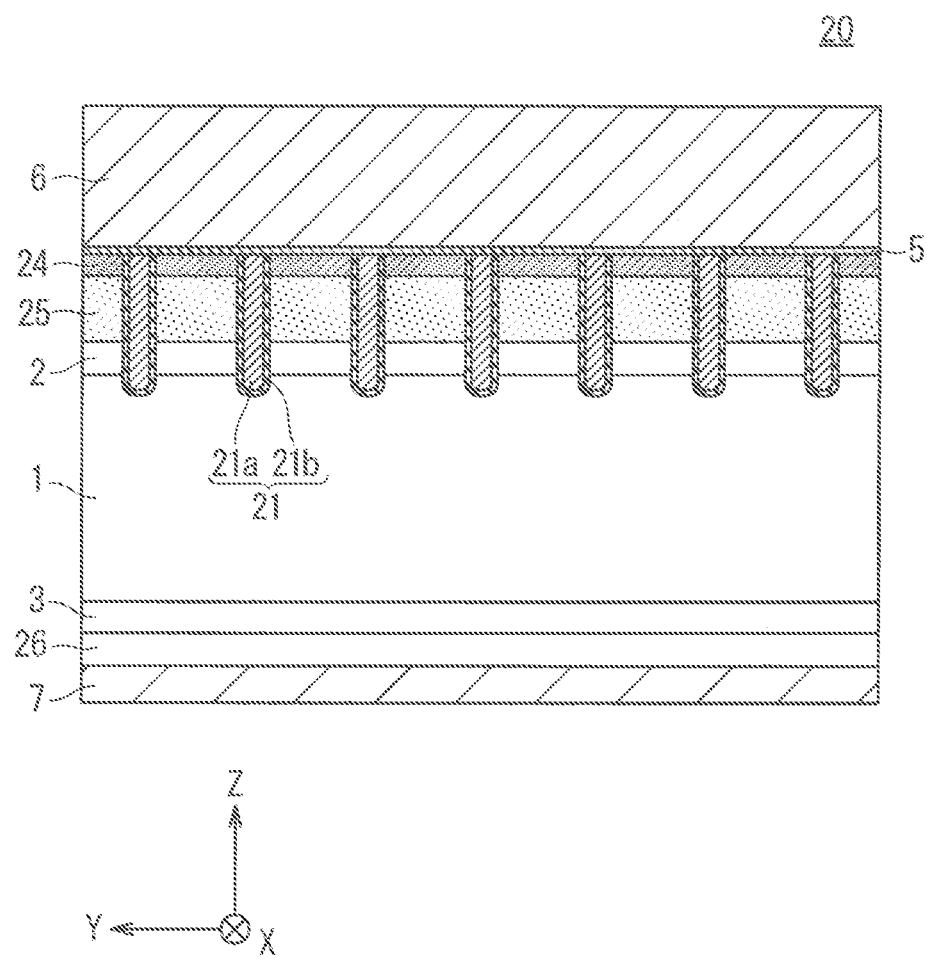

FIG. 6 is a plan view illustrating an example of a configuration of the diode region in the RC-IGBT. FIGS. 7 and 8 are cross-sectional views illustrating an example of the configuration of the diode region in the RC-IGBT.

FIG. 6 is a view illustrating a configuration of a region surrounded by a broken line 83 in the semiconductor device 100 illustrated in FIG. 1 or the semiconductor device 101 illustrated in FIG. 2. Although the diode region 20 will be described below, the same applies to the diode region 20a.

FIG. 7 is a cross-sectional view corresponding to the C-C cross section of the configuration illustrated in FIG. 6, and FIG. 8 is a cross-sectional view corresponding to the D-D cross section of the configuration illustrated in FIG. 6.

The diode trench gate 21 extends along the first main surface of the semiconductor device from one end side of the diode region 20, which is a cell region, toward the opposite end side. The diode trench gate 21 is configured by providing a diode trench electrode 21a in a trench formed in the semiconductor substrate in the diode region 20 via a diode trench insulating film 21b. The diode trench electrode 21a faces the n− type drift layer 1 via the diode trench insulating film 21b.

p+ type contact layers 24 and p type anode layers 25 are provided between the two adjacent diode trench gates 21. The p+ type contact layer 24 is a semiconductor layer containing, for example, boron or aluminum as a p type impurity, and the concentration of the p type impurity is, for example, $1.0 \times 10^{15}/cm^3$ or more and $1.0 \times 10^{20}/cm^3$ or less.

The p type anode layer 25 is a semiconductor layer containing, for example, boron or aluminum as a p type impurity, and the concentration of the p type impurity is, for example, $1.0 \times 10^{12}/cm^3$ or more and $1.0 \times 10^{19}/cm^3$ or less.

The p+ type contact layers 24 and the p type anode layers 25 are alternately provided in the longitudinal direction (X-axis direction) of the diode trench gate 21.

FIG. 7 is a cross-sectional view corresponding to the C-C cross section in FIG. 6, and specifically, is a cross-sectional view of the diode region 20.

The semiconductor device 100 or the semiconductor device 101 also includes the n− type drift layer 1 made of a semiconductor substrate in the diode region 20 (or the diode region 20a) similarly to the IGBT region 10. The n− type drift layer 1 of the diode region 20 and the n− type drift layer 1 of the IGBT region 10 are continuously and integrally formed, and are formed of the same semiconductor substrate. In FIG. 7, the semiconductor substrate corresponds to a configuration in a range from the p+ type contact layer 24 to the n+ type cathode layer 26.

In FIG. 7, the upper end (Z-axis positive direction side) of the p+ type contact layer 24 in the drawing sheet is referred to as the first main surface of the semiconductor substrate, and the lower end (Z-axis negative direction side) of the n+ type cathode layer 26 in the drawing sheet is referred to as the second main surface of the semiconductor substrate. The first main surface of the diode region 20 and the first main surface of the IGBT region 10 are flush, and the second main surface of the diode region 20 and the second main surface of the IGBT region 10 are flush.

As illustrated in the example of FIG. 7, also in the diode region 20, similarly to the IGBT region 10, the n type carrier accumulation layer 2 is provided on the first main surface side of the n− type drift layer 1, and the n type buffer layer 3 is provided on the second main surface side of the n− type drift layer 1.

The n type carrier accumulation layer 2 and the n type buffer layer 3 provided in the diode region 20 have the same configuration as the n type carrier accumulation layer 2 and the n type buffer layer 3 provided in the IGBT region 10. The n type carrier accumulation layer 2 is not necessarily provided in the IGBT region 10 and the diode region 20, and even when the n type carrier accumulation layer 2 is provided in the IGBT region 10, the n type carrier accumulation layer 2 may not be provided in the diode region 20. Similarly to the IGBT region 10, the n− type drift layer 1, the n type carrier accumulation layer 2, and the n type buffer layer 3 may be collectively referred to as a drift layer.

The p type anode layer 25 is provided on the first main surface side of the n type carrier accumulation layer 2. The p type anode layer 25 is provided between the n− type drift layer 1 and the first main surface. The p type anode layer 25 and the p type base layer 15 may be simultaneously formed by making the concentration of the p type impurity of the p type anode layer 25 the same as that of the p type base layer 15 of the IGBT region 10. In addition, the concentration of the p type impurity of the p type anode layer 25 may be set lower than the concentration of the p type impurity of the p type base layer 15 of the IGBT region 10 to reduce the amount of holes injected into the diode region 20 during diode operation. By reducing the amount of holes injected during diode operation, recovery loss during diode operation can be reduced.

The p+ type contact layer 24 is provided on the first main surface side of the p type anode layer 25. The concentration of the p type impurity of the p+ type contact layer 24 may be the same as or different from the concentration of the p type impurity of the p+ type contact layer 14 of the IGBT region 10. The p+ type contact layer 24 constitutes the first main surface of the semiconductor substrate. The p+ type contact layer 24 is a region having a higher concentration of the p type impurity than the p type anode layer 25, and when it is necessary to distinguish the p+ type contact layer 24 and the p type anode layer 25 from each other, they may be referred to individually, and the p+ type contact layer 24 and the p type anode layer 25 may be collectively referred to as a p type anode layer.

In the diode region 20, the n+ type cathode layer 26 is provided on the second main surface side of the n type buffer layer 3. The n+ type cathode layer 26 is provided between the n− type drift layer 1 and the second main surface. The n+ type cathode layer 26 is a semiconductor layer containing, for example, arsenic or phosphorus as an n type impurity, and the concentration of the n type impurity is, for example, $1.0 \times 10^{16}/cm^3$ or more and $1.0 \times 10^{21}/cm^3$ or less.

The n+ type cathode layer 26 is provided in a part or an entirety of the diode region 20. The n+ type cathode layer 26 constitutes the second main surface of the semiconductor substrate. A p type impurity may be further selectively implanted into the region where the n+ type cathode layer 26 is formed as described above to provide a p type cathode layer as a p type semiconductor in a part of the region where the n+ type cathode layer 26 is formed.

As illustrated in the example of FIG. 7, in the diode region 20, a trench that penetrates the p type anode layer 25 from the first main surface of the semiconductor substrate and reaches the n– type drift layer 1 is formed. The diode trench gate 21 is configured by providing the diode trench electrode 21a in the trench in the diode region 20 via the diode trench insulating film 21b. The diode trench electrode 21a faces the n– type drift layer 1 via the diode trench insulating film 21b.

As illustrated in the example of FIG. 7, the barrier metal 5 is provided on the upper surfaces of the diode trench electrodes 21a and the p+ type contact layer 24. The barrier metal 5 is in ohmic contact with the diode trench electrodes 21a and the p+ type contact layer 24, and is electrically connected to the diode trench electrodes and the pf type contact layer 24.

The barrier metal 5 may have the same configuration as the barrier metal 5 in the IGBT region 10. The emitter electrode 6 is provided on the upper surface of the barrier metal 5.

The emitter electrode 6 provided in the diode region 20 is formed continuously with the emitter electrode 6 provided in the IGBT region 10. As in the case of the IGBT region 10, the diode trench electrodes 21a and the p+ type contact layer 24 may be brought into ohmic contact with the emitter electrode 6 without providing the barrier metal 5. In FIG. 7, the interlayer insulating film 4 is not provided on the upper surfaces of the diode trench electrodes 21a of the diode trench gates 21, but the interlayer insulating film 4 may be formed on the upper surfaces of the diode trench electrodes 21a of the diode trench gates 21. When the interlayer insulating film 4 is formed on the upper surfaces of the diode trench electrodes 21a of the diode trench gates 21, the emitter electrode 6 and the diode trench electrodes 21a may be electrically connected in another cross section.

The collector electrode 7 is provided on the second main surface side of the n+ type cathode layer 26. Similarly to the emitter electrode 6, the collector electrode 7 in the diode region 20 is formed continuously with the collector electrode 7 provided in the IGBT region 10. The collector electrode 7 is in ohmic contact with the n+ type cathode layer 26 and is electrically connected to the n+ type cathode layer 26.

FIG. 8 is a cross-sectional view of the semiconductor device 100 or the semiconductor device 101 corresponding to the D-D cross section in FIG. 6, specifically, a cross-sectional view of the diode region 20.

The cross-sectional view corresponding to the D-D cross section illustrated in FIG. 8 is different from the cross-sectional view corresponding to the C-C cross section illustrated in FIG. 7 in that the p+ type contact layer 24 is not provided between the p type anode layer 25 and the barrier metal 5, and the p type anode layer 25 constitutes the first main surface of the semiconductor substrate. That is, the p+ type contact layer 24 illustrated in FIG. 7 is selectively provided on the first main surface side of the p type anode layer 25.

<Boundary Region Between IGBT Region and Diode Region>

Figure 9:
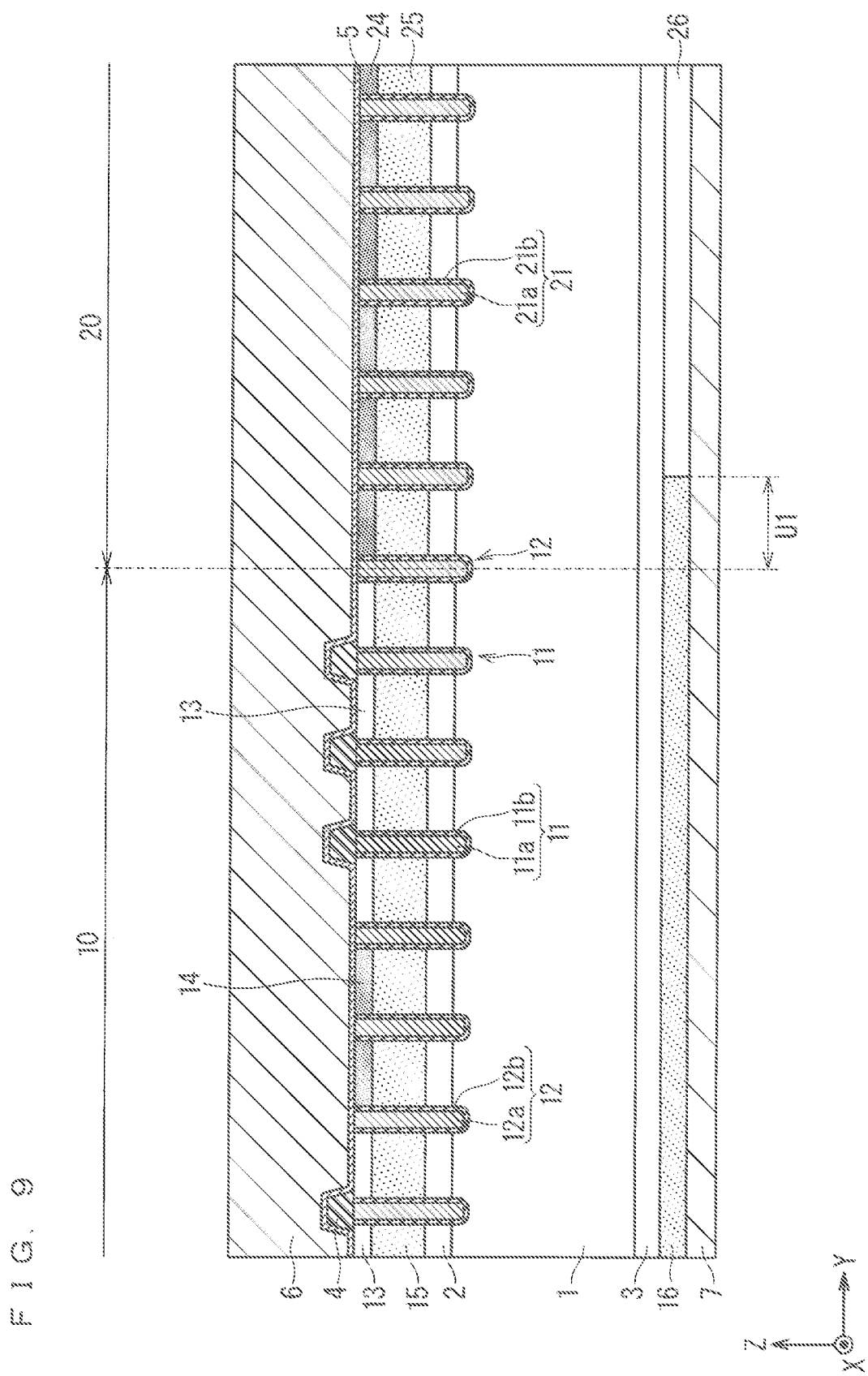
FIG. 9 is a cross-sectional view illustrating an example of a configuration of a boundary region between the IGBT region and the diode region in the RC-IGBT.

FIG. 9 is a cross-sectional view illustrating an example of a configuration of a boundary region between the IGBT region and the diode region in the RC-IGBT. FIG. 9 is a cross-sectional view corresponding to the G-G cross section of the semiconductor device 100 or the semiconductor device 101 illustrated in FIG. 1.

As illustrated in the example of FIG. 9, the p type collector layer 16 provided on the second main surface side of the IGBT region 10 is provided so as to protrude toward the diode region 20 from the boundary between the IGBT region 10 and the diode region 20 by a distance UL.

As described above, by providing the p type collector layer 16 so as to protrude to the diode region 20, the distance between the n+ type cathode layer 26 of the diode region 20 and the active trench gate 11 can be increased.

Then, even when a gate drive voltage is applied to the active trench electrode 11a during freewheeling diode operation, a current can be suppressed from flowing from a channel formed adjacent to the active trench gate 11 of the IGBT region 10 to the n+ type cathode layer 26.

The distance U1 may be, for example, 100 μm. The distance U1 may be 0 or a distance smaller than 100 μm depending on the application of the semiconductor device 100 or the semiconductor device 101 which is an RC-IGBT.

<Structure of Termination Region>

Figure 10:
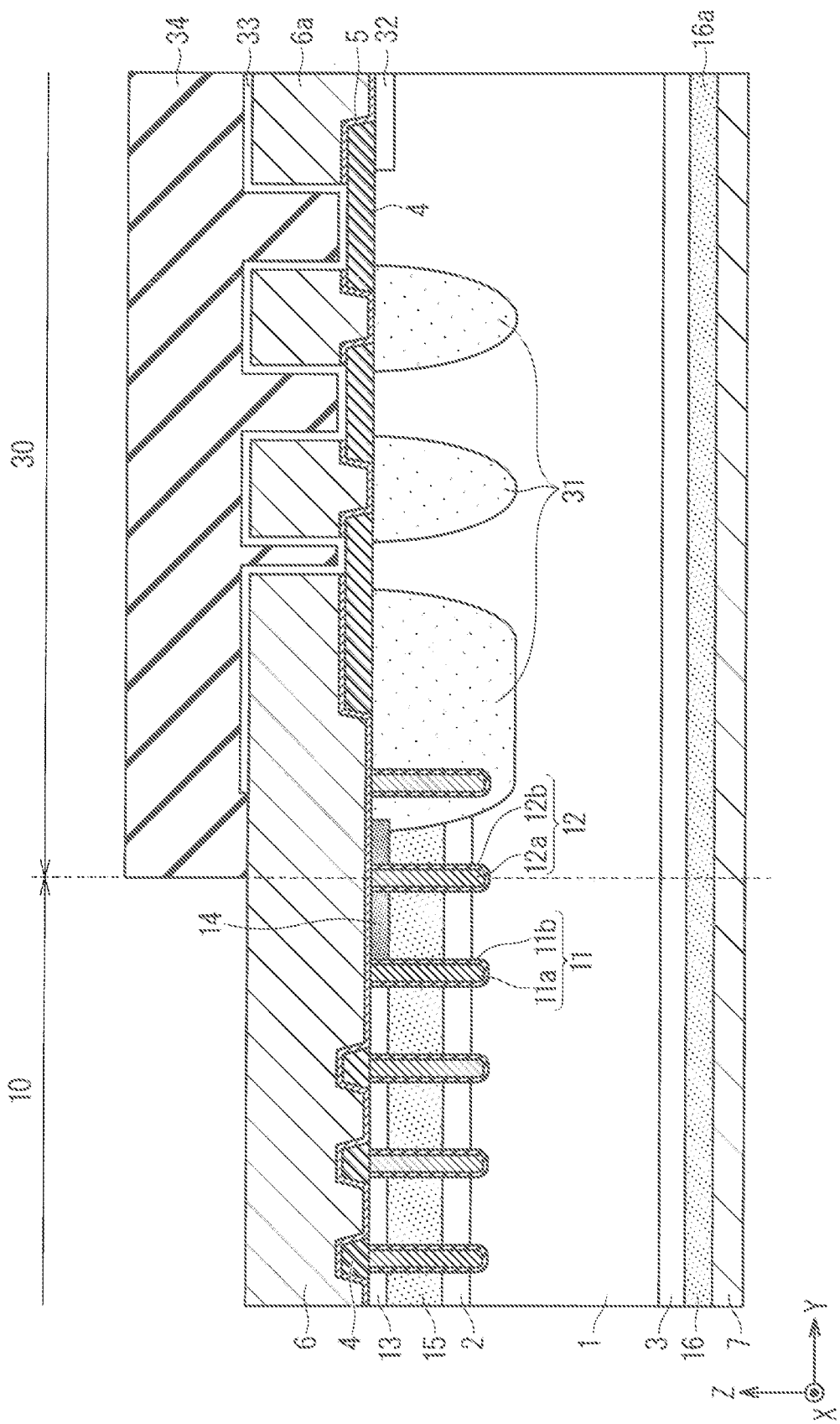
FIGS. 10 and 11 are cross-sectional views each illustrating an example of a configuration of a termination region in the RC-IGBT.
Figure 11:
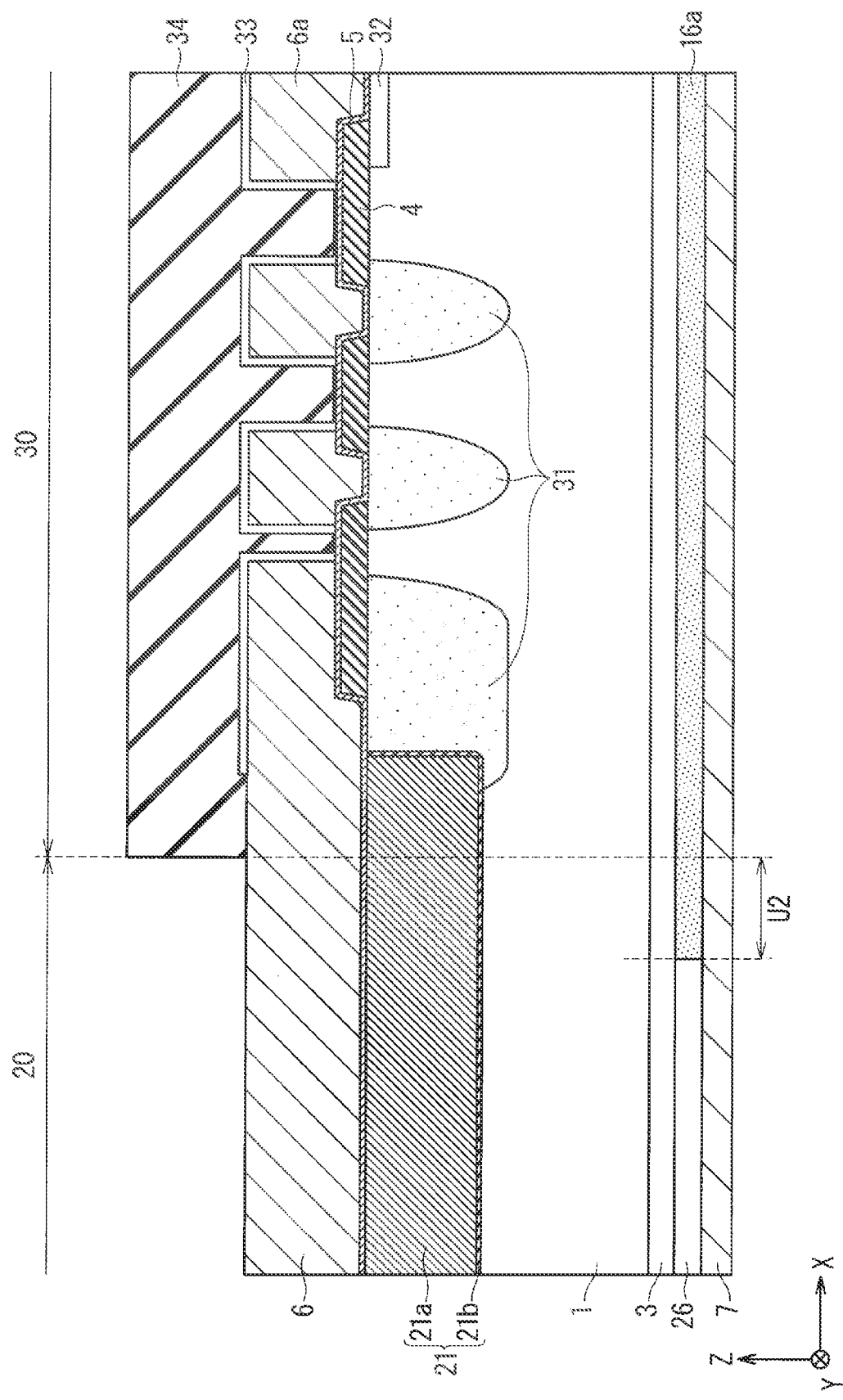

FIGS. 10 and 11 are cross-sectional views illustrating an example of a configuration of the termination region in the RC-IGBT. FIG. 10 is a cross-sectional view corresponding to the E-E cross section in FIG. 1 or 2, specifically, a cross-sectional view from the IGBT region 10 to the termination region 30. FIG. 11 is a cross-sectional view corresponding to the F-F cross section in FIG. 1, specifically, a cross-sectional view from the diode region 20 to the termination region 30.

As illustrated in the examples of FIGS. 10 and 11, the termination region 30 of the semiconductor device 100 includes the n– type drift layer 1 between the first main surface and the second main surface of the semiconductor substrate. The first main surface and the second main surface of the termination region 30 are flush with the first main surfaces and the second main surfaces of the IGBT region 10 and the diode region 20, respectively. The n– type drift layer 1 in the termination region 30 has the same configuration as the n– type drift layer 1 of each of the IGBT region 10 and the diode region 20, and is continuously and integrally formed.

p type termination well layers 31 are provided on the first main surface side of the n– type drift layer 1, that is, between the first main surface of the semiconductor substrate and the n– type drift layer 1. The p type termination well layer 31 is a semiconductor layer containing, for example, boron or aluminum as a p type impurity, and the concentration of the p type impurity is, for example, $1.0 \times 10^{14}/cm^3$ or more and $1.0 \times 10^{19}/cm^3$ or less.

The p type termination well layer 31 is provided to surround the cell region including the IGBT region 10 and the diode region 20. The p type termination well layers 31 are provided in a plurality of ring shapes, and the number of the p type termination well layers 31 to be provided is appropriately selected according to the withstand voltage design of the semiconductor device 100 or the semiconductor device 101.

Further, an n+ type channel stopper layer 32 is provided on the further outer edge side of the p type termination well layers 31. The n+ type channel stopper layer 32 surrounds the p type termination well layers 31.

The p type termination collector layer 16a is provided between the n– type drift layer 1 and the second main surface of the semiconductor substrate. The p type termination collector layer 16a is formed integrally and continuously with the p type collector layer 16 provided in the cell region. Therefore, the p type termination collector layer 16a may be referred to as the p type collector layer 16.

In addition, in the configuration in which the diode region 20 is provided adjacent to the termination region 30 as in the semiconductor device 100 illustrated in FIG. 1, as illustrated in the example of FIG. 11, the p type termination collector layer 16a is provided such that the end portion on the diode region 20 side protrudes to the diode region 20 by a distance U2.

As described above, since the p type termination collector layer 16a is provided so as to protrude to the diode region 20, the distance between the n+ type cathode layer 26 of the diode region 20 and the p type termination well layer 31 can be increased, and the p type termination well layer 31 can be suppressed from operating as an anode of a diode. The distance U2 may be, for example, 100 μm.

The collector electrode 7 is provided on the second main surface of the semiconductor substrate. The collector electrode 7 is integrally formed continuously from the cell region including the IGBT region 10 and the diode region 20 to the termination region 30. On the other hand, on the first main surface of the semiconductor substrate in the termination region 30, the emitter electrode 6 continuous from the cell region and the termination electrode 6a separated from the emitter electrode 6 are provided.

The emitter electrode 6 and the termination electrode 6a are electrically connected via a semi-insulating film 33. The semi-insulating film 33 may be, for example, sinSiN (semi-insulating silicon nitride: semi-insulating silicon nitride film).

The termination electrode 6a, the p type termination well layers 31, and the n+ type channel stopper layer 32 are electrically connected via contact holes formed in the interlayer insulating film 4 provided on the first main surface of the termination region 30.

In addition, in the termination region 30, a termination protection film 34 is provided to cover the emitter electrode 6, the termination electrode 6a, and the semi-insulating film 33. The termination protection film 34 may be made of polyimide, for example.

<Structure of Temperature Sensing Diode>

FIG. 12 is a cross-sectional view illustrating an example of a structure of a temperature sensing diode (temperature sensing diode). As illustrated in the example of FIG. 12, a temperature sensing diode 200 is formed on an upper surface of a p type diffusion layer 202. The p type diffusion layer 202 is formed on the surface layer of the n− type drift layer 1, and the n type buffer layer 3 is formed on the lower surface of the n− type drift layer 1. Further, a p+ type collector layer 204 is formed on the lower surface of the n type buffer layer 3, and an electrode layer 206 is formed on the lower surface of the p+ type collector layer 204.

The temperature sensing diode 200 includes an interlayer insulating film 208a formed on the upper surface of the p type diffusion layer 202, p+ type anode layers 210 partially formed on the upper surface of the interlayer insulating film 208a, p type drift layers 212 partially formed on the upper surface of the interlayer insulating film 208a while being adjacent to the p+ type anode layers 210, an n+ type cathode layer 214 partially formed on the upper surface of the interlayer insulating film 208a while being sandwiched by the p type drift layers 212, interlayer insulating films 208b formed to cover a part of the upper surface of the p+ type anode layer 210, the tipper surface of the p type drift layer 212, and a part of the upper surface of the n+ type cathode layer 214, anode electrodes 216 each formed in contact with the upper surface of the p+ type anode layer 210 exposed from the interlayer insulating film 208b, and a cathode electrode 218 formed in contact with the upper surface of the n+ type cathode layer 214 exposed from the interlayer insulating films 208b. Although not illustrated here, a barrier metal may be formed at the interface between the electrode and the interlayer insulating film and the interface between the electrode and the PolySi layer.

A diode for detecting the element temperature of the IGBT is configured using a polysilicon (PolySi) film on the upper surface of the interlayer insulating film 208a on the Si substrate. Therefore, a portion where the temperature detection (temperature sensing) diode is formed forms a step, and the step may cause problems such as generation of residual foreign matter, generation of unevenness in resist coating at the time of photolithography, and generation of defocus.

Figure 13:
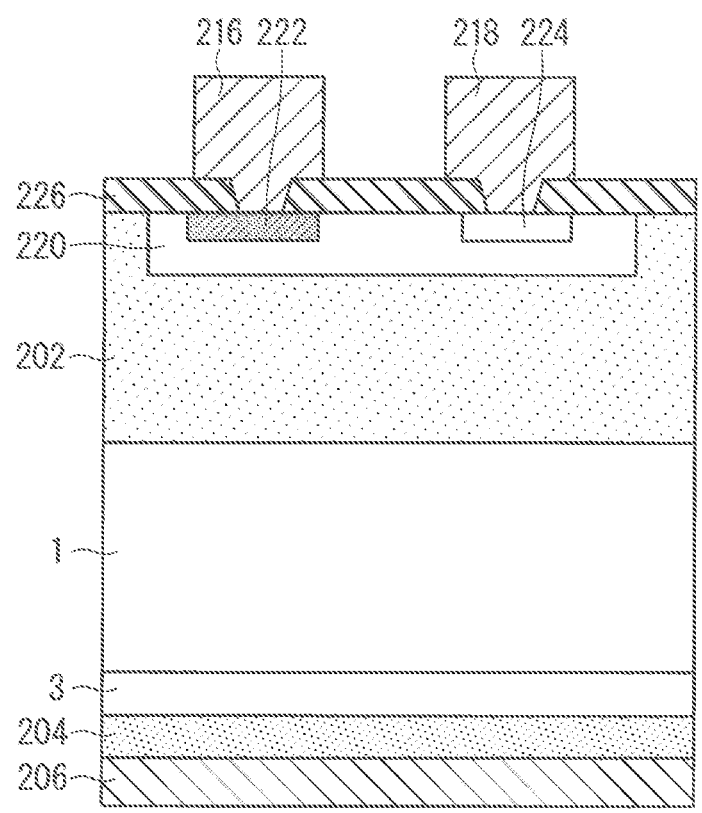

FIG. 13 is a cross-sectional view illustrating another example of the structure of the temperature sensing diode. As illustrated in the example of FIG. 13, a temperature sensing diode is formed in the p type diffusion layer 202. The p type diffusion layer 202 is formed on the surface layer of the n− type drift layer 1, and the n type buffer layer 3 is formed on the lower surface of the n− type drift layer 1. Further, the p+ type collector layer 204 is formed on the lower surface of the n type buffer layer 3, and the electrode layer 206 is formed on the lower surface of the p+ type collector layer 204.

The temperature sensing diode includes an n type well diffusion layer 220 formed by diffusing in a surface layer of a p type diffusion layer 202, a p+ type anode layer 222 formed by diffusing in a surface layer of the n type well diffusion layer 220, an n+ type cathode layer 224 formed by diffusing in a surface layer of the n type well diffusion layer 220 while being separated from the p+ type anode layer 222, interlayer insulating films 226 formed to cover a part of an upper surface of the p+ type anode layer 222, and a part of an upper surface of the n+ type cathode layer 224, an anode electrode 216 formed in contact with an upper surface of the p+ type anode layer 222 exposed from the interlayer insulating films 226, and a cathode electrode 218 formed in contact with an upper surface of the n+ type cathode layer 224 exposed from the interlayer insulating films 226. Although not illustrated here, a barrier metal may be formed at the interface between the electrode and the interlayer insulating film and the interface between the electrode and the PolySi layer.

A diode for detecting the element temperature of the IGBT is configured in the Si substrate. A temperature sensing diode is constructed in junction isolation by the n type well diffusion layer 220 while suppressing interference with an adjacent IGBT element.

With such a structure, the level difference can be reduced as compared with the case of a temperature sensing diode including a PolySi film on the upper surface of the interlayer insulating film.

However, in such a structure, there is a parasitic PNP bipolar transistor including the p+ type anode layer 222, the n type well diffusion layer 220, and the p type diffusion layer 202. When the parasitic PNP bipolar transistor operates, characteristics as the temperature sensing diode fluctuate. Therefore, it is necessary to suppress the operation of the parasitic PNP bipolar transistor, and for this purpose, measures such as forming the n type well diffusion layer 220 sufficiently deep can be considered, but it is difficult to completely suppress the parasitic PNP bipolar transistor operation.

Figure 14:
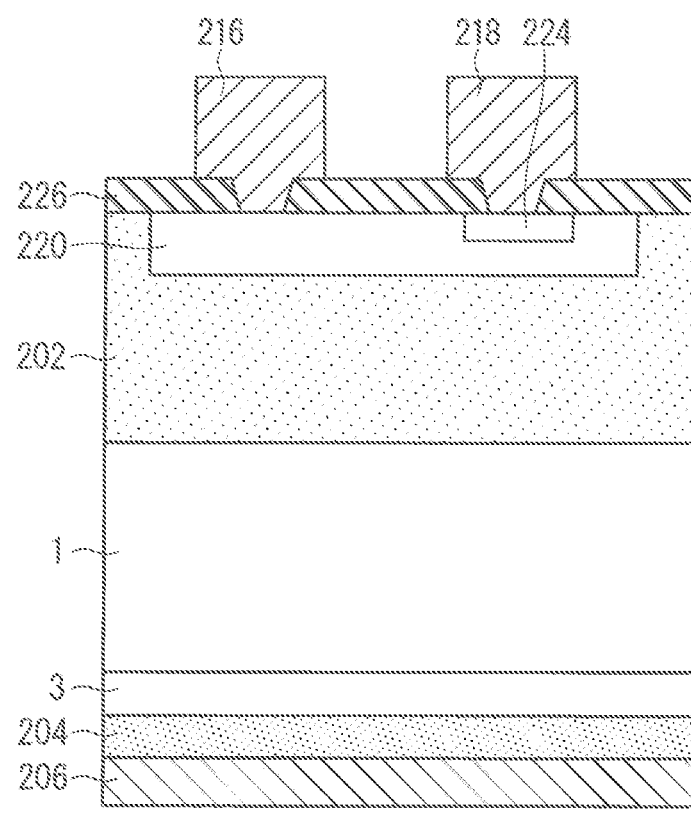
FIG. 14 is a cross-sectional view illustrating an example of a configuration of a temperature sensing diode in a temperature detection region according to the preferred embodiment.

FIG. 14 is a cross-sectional view illustrating an example of a configuration of a temperature sensing diode in a temperature detection region according to the present preferred embodiment. As illustrated in the example of FIG. 14, the temperature sensing diode is formed in the p type diffusion layer 202. The p type diffusion layer 202 is formed on the surface layer of the n− type drift layer 1, and the n type buffer layer 3 is formed on the lower surface of the n− type drift layer 1. Further, the p+ type collector layer 204 is formed on the lower surface of the n type buffer layer 3, and the electrode layer 206 is formed on the lower surface of the p+ type collector layer 204.

The temperature sensing diode includes an n type well diffusion layer 220 formed by diffusing in the surface layer of the p type diffusion layer 202, an n+ type cathode layer 224 formed by diffusing in the surface layer of the n type well diffusion layer 220, interlayer insulating films 226 formed to cover a part of the upper surface of the n type well diffusion layer 220 and a part of the upper surface of the n+ type cathode layer 224, an anode electrode 216 formed in contact with the upper surface of the n type well diffusion layer 220 exposed from the interlayer insulating films 226, and a cathode electrode 218 formed in contact with the upper surface of the n+ type cathode layer 224 exposed from the interlayer insulating films 226.

Although not illustrated here, a barrier metal may be formed at the interface between the electrode and the interlayer insulating film and the interface between the electrode and the PolySi layer. However, in a Schottky junction surface where the anode electrode 216 and the n type well diffusion layer 220 are in contact with each other, the barrier height of the Schottky diode varies depending on the electrode material to be joined. Therefore, the electrode is selected according to the required characteristic of the temperature sensing diode. The electrode is desirably, for example, Al or an Al-based alloy.

As described above, the anode electrode 216 is in direct contact with the n type well diffusion layer 220, whereby the n type well diffusion layer 220 and the n+ type cathode layer 224 constitute the Schottky diode. Since the Schottky diode performs unipolar operation driven only by electrons, the operation of the parasitic PNP bipolar transistor can be suppressed.

Here, the p type diffusion layer 202 may be formed simultaneously with the p type base layer 15 of the IGBT region 10 to have the same depth and the same concentration as the p type base layer 15.

In addition, the p type diffusion layer 202 may be formed simultaneously with the p type termination well layer 31 of the termination region 30 to have the same depth and the same concentration as those of the p type termination well layer 31.

In addition, the n+ type cathode layer 224 may be formed simultaneously with the n+ type source layer 13 of the IGBT region 10 to have the same depth and the same concentration as the n+ type source layer 13.

By combining these, the additional step for forming the temperature sensing diode can be only the step of forming the n type well diffusion layer 220. Therefore, it is possible to suppress an increase in the number of man-hours for making the temperature sensing diode.

Second Preferred Embodiment

A semiconductor device according to the present preferred embodiment will be described. In the following description, components similar to the components described in the preferred embodiment described above are denoted by the same reference numerals, and detailed description thereof will be omitted as appropriate.

<Configuration of Semiconductor Device>

FIG. 15 is a cross-sectional view illustrating an example of a configuration of a temperature sensing diode according to the present preferred embodiment. As illustrated in the example of FIG. 15, the temperature sensing diode is formed in a p type diffusion layer 202. The p type diffusion layer 202 is formed on a surface layer of an n− type drift layer 1, and a n type buffer layer 3 is formed on a lower surface of the n− type drift layer 1. Further, a p+ type collector layer 204 is formed on a lower surface of the n type buffer layer 3, and an electrode layer 206 is formed on a lower surface of the p+ type collector layer 204.

The temperature sensing diode includes an n type well diffusion layer 220 formed by diffusing in a surface layer of a p type diffusion layer 202, p+ type anode layer 228 formed by diffusing in a surface layer of the n type well diffusion layer 220, an n+ type cathode layer 224 formed by diffusing in a surface layer of the n type well diffusion layer 220 while being separated from the p+ type anode layer 228, interlayer insulating films 226 formed to cover a part of an upper surface of the n type well diffusion layer 220, parts of upper surfaces of the p+ type anode layers 228, and a part of an upper surface of the n+ type cathode layer 224, an anode electrode 216 formed in contact with the upper surface of the n type well diffusion layer 220 and the upper surfaces of the p+ type anode layers 228 exposed from the interlayer insulating films 226, and a cathode electrode 218 formed in contact with an upper surface of the n+ type cathode layer 224 exposed from the interlayer insulating films 226.

The p+ type anode layers 228 are formed so as to cover an end portion of a Schottky junction surface where the n type well diffusion layer 220 and the anode electrode 216 are in contact with each other in plan view. This formation can stabilize the withstand voltage of the Schottky junction.

The interval between the end portions of the p+ type anode layers 228, which is the path of the current flowing from the Schottky junction, on the Schottky junction surface is sufficiently wide to the extent that the diode including the p+ type anode layers 228 and the n type well diffusion layer 220 does not operate.

Further, the p+ type anode layers 228 may be formed simultaneously with a p+ type contact layer 14 formed in an IGBT region 10 to have the same depth and the same concentration as the p+ type contact layer 14. With this, the above configuration can be manufactured without adding a process.

Third Preferred Embodiment

A semiconductor device according to the present preferred embodiment will be described. In the following description, components similar to the components described in the preferred embodiment described above are denoted by the same reference numerals, and detailed description thereof will be omitted as appropriate.

<Configuration of Semiconductor Device>

Figure 16:
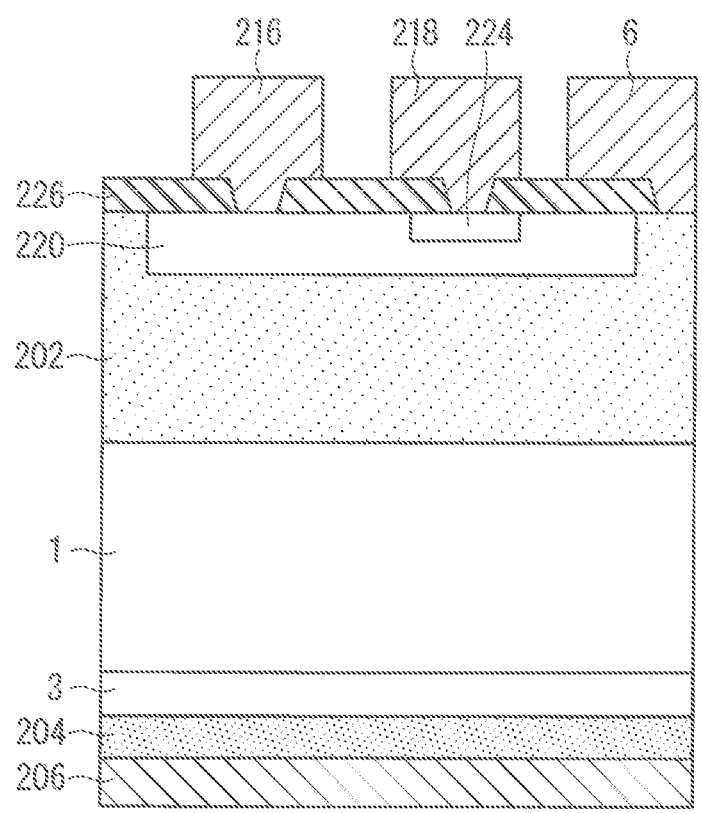

FIG. 16 is a cross-sectional view illustrating an example of a configuration of a temperature sensing diode according to the present preferred embodiment. As illustrated in the example of FIG. 16, the temperature sensing diode is formed in a p type diffusion layer 202. The p type diffusion layer 202 is formed on a surface layer of an n− type drift layer 1, and a n type buffer layer 3 is formed on a lower surface of the n− type drift layer 1. Further, a p+ type collector layer 204 is formed on a lower surface of the n type buffer layer 3, and an electrode layer 206 is formed on a lower surface of the p+ type collector layer 204.

The temperature sensing diode includes an n type well diffusion layer 220 formed by diffusing in a surface layer of a p type diffusion layer 202, an n+ type cathode layer 224 formed by diffusing in a surface layer of the n type well diffusion layer 220, interlayer insulating films 226 formed to cover a part of an upper surface of the n type well diffusion layer 220, a part of an upper surface of the p type diffusion layer 202, and a part of an upper surface of the n+ type cathode layer 224, an anode electrode 216 formed in contact with the upper surface of the n type well diffusion layer 220 exposed from the interlayer insulating films 226, a cathode electrode 218 formed in contact with the upper surface of the n+ type cathode layer 224 exposed from the interlayer insulating films 226, and an emitter electrode 6 formed in contact with the upper surface of the p type diffusion layer 202 exposed from the interlayer insulating film 226. The anode electrode 216 and the cathode electrode 218 may be formed simultaneously with the emitter electrode 6, and may have the same thickness.

According to such a configuration, by connecting the p type diffusion layer 202 to the emitter electrode 6 of the IGBT, junction isolation can be stabilized, and characteristics of the temperature sensing diode can be further stabilized.

Figure 17:
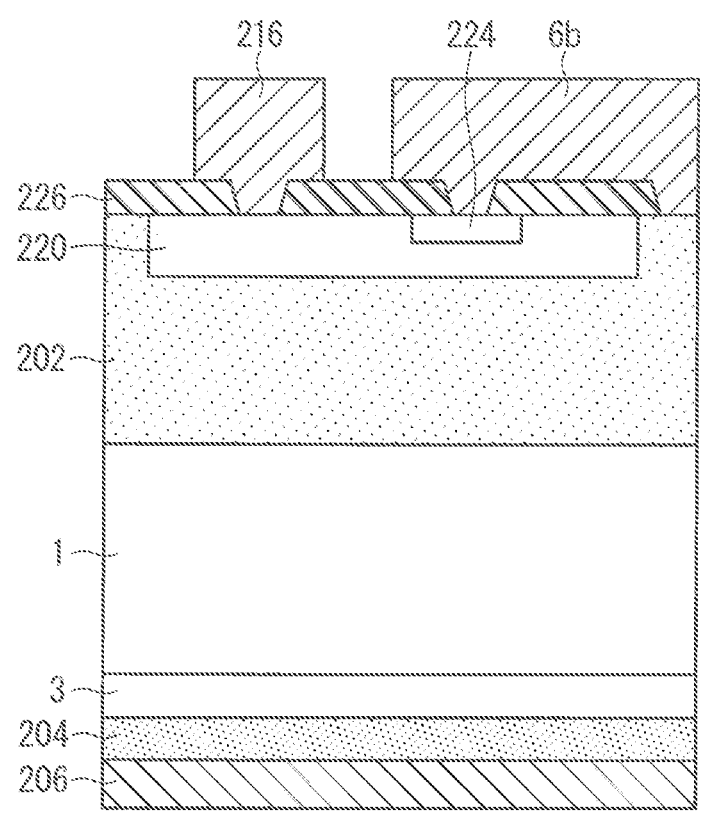
FIG. 17 is a cross-sectional view illustrating another example of the configuration of the temperature sensing diode according to the preferred embodiment.

FIG. 17 is a cross-sectional view illustrating another example of the configuration of the temperature sensing diode according to the present preferred embodiment. As illustrated in the example of FIG. 17, the temperature sensing diode is formed in a p type diffusion layer 202. The p type diffusion layer 202 is formed on the surface layer of the n− type drift layer 1, and the n type buffer layer 3 is formed on the lower surface of the n− type drift layer 1. Further, the p+ type collector layer 204 is formed on the lower surface of the n type buffer layer 3, and the electrode layer 206 is formed on the lower surface of the p+ type collector layer 204.

The temperature sensing diode includes an n type well diffusion layer 220 formed by diffusing in a surface layer of a p type diffusion layer 202, an n+ type cathode layer 224 formed by diffusing in a surface layer of the n type well diffusion layer 220, interlayer insulating films 226 formed to cover a part of an upper surface of the n type well diffusion layer 220, a part of an upper surface of the p type diffusion layer 202, and a part of an upper surface of the n+ type cathode layer 224, an anode electrode 216 formed in contact with the upper surface of the n type well diffusion layer 220 exposed from the interlayer insulating films 226, and an emitter electrode 6b formed in contact with the upper surface of the n+ type cathode layer 224 exposed from the interlayer insulating films 226 and the upper surface of the p type diffusion layer 202 exposed from the interlayer insulating film 226. The anode electrode 216 may be formed simultaneously with the emitter electrode 6b, and may have the same thickness.

According to such a configuration, the cathode electrode can be configured as a part of the emitter electrode 6b of the IGBT.

<Effects Produced by Preferred Embodiments Described Above>

Next, examples of effects produced by the preferred embodiments described above will be described. In the following description, the effects will be described based on the specific configurations exemplified in the preferred embodiments described above, but may be replaced with other specific configurations exemplified in the present specification as long as similar effects are produced. That is, in the following description, for convenience, only one of the associated specific configurations may be described as a representative, but the specific configuration described as a representative may be replaced with another specific configuration associated.

Furthermore, the replacement may be performed across a plurality of preferred embodiments. That is, the same effect may be produced by combining the respective configurations exemplified in different preferred embodiments.

According to the preferred embodiments described above, the semiconductor device includes the temperature detection region, the IGBT region 10 (corresponding to a switching element region) at least partially surrounding the temperature detection region in plan view, and a signal pad region 40. In the temperature detection region, a diffusion layer of a second conductivity type, a well layer of a first conductivity type, and a cathode layer of the first conductivity type are provided. Here, the diffusion layer corresponds to, for example, the p type diffusion layer 202 or the like. The well layer corresponds to, for example, the n type well diffusion layer 220 or the like. The cathode layer corresponds to, for example, the n+ type cathode layer 224 or the like. The p type diffusion layer 202 is provided on the surface layer of the drift layer of the first conductivity type. Here, the drift layer corresponds to, for example, the n− type drift layer 1 or the like. The n type well diffusion layer 220 is provided on the surface layer of the p type diffusion layer 202. In addition, the n type well diffusion layer 220 is electrically connected to the anode electrode 216. The n+ type cathode layer 224 is provided on the surface layer of the n type well diffusion layer 220. The n+ type cathode layer 224 is electrically connected to the cathode electrode 218. Here, the n+ type cathode layer 224 has an impurity concentration higher than that of the n type well diffusion layer 220. In the IGBT region 10, a base layer of the second conductivity type, a source layer of the first conductivity type, a plurality of trenches, and a gate electrode are provided. Here, the base layer corresponds to, for example, the p type base layer 15 or the like. In addition, the source layer corresponds to, for example, the n+ type source layer 13 or the like. The gate electrode corresponds to, for example, the active trench electrode 11a or the dummy trench electrode 12a or the like. The p type base layer 15 is provided on the surface layer of the semiconductor layer of the first conductivity type. Here, the semiconductor layer corresponds to, for example, the n− type drift layer 1 or the n type carrier accumulation layer 2 or the like. The n+ type source layer 13 is partially provided on the surface layer of the p type base layer 15. The plurality of trenches are provided from the upper surface of the p type base layer 15 to the inside of the n− type drift layer 1. The active trench electrode 11a is provided to be surrounded by the active trench insulating film 11b in the trench. An anode pad electrically connected to the anode electrode 216 and a cathode pad electrically connected to the cathode electrode 218 are provided in the signal pad region 40. Here, the anode pad corresponds to, for example, the temperature sensing diode pad 41d or the like. The cathode pad corresponds to, for example, the temperature sensing diode pad 41e or the like.

According to such a configuration, by using a Schottky diode that performs unipolar operation as the temperature sensing diode, the operation of the parasitic bipolar transistor can be suppressed, and variations in characteristics of the temperature sensing diode can be suppressed. As a result, the accuracy of temperature detection can be improved.

Even in a case where another configuration exemplified in the present specification is appropriately added to the above configuration, that is, even in a case where another configuration not mentioned as the above configuration in the present specification is appropriately added, a similar effect can be generated.

According to the preferred embodiments described above, the anode layer of the second conductivity type is provided in the temperature detection region. Here, the anode layer corresponds to, for example, the p+ type anode layer 228 or the like. The p+ type anode layers 228 are provided at the end portions of the Schottky junction portion in plan view in the Schottky junction portion where the n type well diffusion layer 220 and the anode electrode 216 are in contact with each other. According to such a configuration, since the end portions of the Schottky junction portion can be covered with the p+ type anode layers 228, the withstand voltage of the Schottky junction can be stabilized.

According to the preferred embodiments described above, in the IGBT region 10, the n+ type source layer 13 is electrically connected to the emitter electrode 6. In the temperature detection region, the p type diffusion layer 202 is connected to the emitter electrode 6. According to such a configuration, by setting the p type diffusion layer 202 constituting the junction isolation to the same potential as the emitter electrode 6, the junction isolation can be stabilized. Therefore, the characteristics of the temperature sensing diode can be stabilized.

According to the preferred embodiments described above, the semiconductor device includes the diode region 20 (or the diode region 20a) provided adjacent to the 101T region 10. The temperature detection region is provided to be surrounded by the IGBT region 10. According to such a configuration, even in the RC-IGBT in which the temperature detection region is disposed at a position surrounded by the IGBT region 10, variations in characteristics of the temperature sensing diodes can be suppressed.

According to the preferred embodiments described above, the semiconductor device includes the diode region 20 (or the diode region 20a) surrounding the temperature detection region in plan view. The IGBT region 10 at least partially surrounds the diode region 20 (or the diode region 20a). According to such a configuration, even in the RC-IGBT in which the temperature detection region is disposed at a position surrounded by the diode region 20 (or the diode region 20a), variations in characteristics of the temperature sensing diodes can be suppressed. In addition, the temperature at the time of diode operation can be detected.

Modifications of Preferred Embodiments Described Above

In the preferred embodiments described above, a material quality, a material, a dimension, a shape, a relative arrangement relationship, an implementation condition, or the like of each component may also be described, but these are one example in all aspects and are not restrictive.

Therefore, innumerable modifications and equivalents in which no examples are shown are assumed within the scope of the technology disclosed in the present specification. For example, a case where at least one component is modified, added, or omitted, and a case where at least one component in at least one preferred embodiment is extracted and combined with a component in another preferred embodiment are included.

In addition, in the preferred embodiments described above, in a case where a material name or the like is described without being particularly specified, unless there is a contradiction, the material includes other additives, for example, an alloy or the like.

In addition, unless there is a contradiction, when it is described in the above-described preferred embodiments that "one" component is provided, "one or more" components may be provided.

Furthermore, each component in the preferred embodiments described above is a conceptual unit, and the scope of the technology disclosed in the present specification includes a case where one component includes a plurality of structures, a case where one component corresponds to a pan of a certain structure, and a case where a plurality of components is included in one structure.

In addition, each component in the preferred embodiments described above includes a structure having another structure or shape as long as the same function is exhibited.

Furthermore, in the preferred embodiments described above, the semiconductor device in which the IGBT region 10 and the diode region 20 are provided is shown, but a case where the configuration in the IGBT region 10 is replaced from an IGBT to a metal-oxide-semiconductor field-effect transistor (that is, MOSFET) can also be assumed. That is, the configuration provided in the region corresponding to the IGBT region 10 may be a switching element including an IGBT and a MOSFET.

In addition, the description in the present specification herein is referred to for all purposes relating to the present technology, and none of them is recognized as conventional technology.

While the disclosure has been shown and described in detail, the foregoing description is in all aspects illustrative and not restrictive. It is therefore understood that numerous modifications and variations can be devised.

What is claimed is:

1. A semiconductor device comprising:
   a temperature detection region;
   a switching element region that at least partially surrounds the temperature detection region in plan view; and
   a signal pad region,
   wherein the temperature detection region is provided with a diffusion layer of a second conductivity type provided on a surface layer of a drift layer of a first conductivity type, a well layer of the first conductivity type provided on a surface layer of the diffusion layer and electrically connected to an anode electrode, and a cathode layer of the first conductivity type provided on a surface layer of the well layer and electrically connected to a cathode electrode,
   the cathode layer has a higher impurity concentration than the well layer,
   the switching element region is provided with a base layer of the second conductivity type provided on a surface layer of a semiconductor layer of the first conductivity type, a source layer of the first conductivity type provided partially on a surface layer of the base layer, a plurality of trenches provided from an upper surface of the base layer to an inside of the semiconductor layer, and a plurality of gate electrodes each provided to be surrounded by a gate insulating film in one of the plurality of trenches, and
   the signal pad region is provided with an anode pad electrically connected to the anode electrode and a cathode pad electrically connected to the cathode electrode.

2. The semiconductor device according to claim 1, wherein, in a Schottky junction portion where the well layer and the anode electrode are in contact with each other in the temperature detection region, an anode layer of the second conductivity type is further provided at an end portion of the Schottky junction portion in plan view.

3. The semiconductor device according to claim 2, wherein
the source layer is electrically connected to an emitter electrode in the switching element region, and
the diffusion layer is connected to the emitter electrode in the temperature detection region.

4. The semiconductor device according to claim 2, further comprising a diode region provided adjacent to the switching element region,
wherein the temperature detection region is provided to be surrounded by the switching element region.

5. The semiconductor device according to claim 2, further comprising a diode region that surrounds the temperature detection region in plan view,
wherein the switching element region at least partially surrounds the diode region.

6. The semiconductor device according to claim 1, wherein
the source layer is electrically connected to an emitter electrode in the switching element region, and
the diffusion layer is connected to the emitter electrode in the temperature detection region.

7. The semiconductor device according to claim 6, further comprising a diode region provided adjacent to the switching element region,
wherein the temperature detection region is provided to be surrounded by the switching element region.

8. The semiconductor device according to claim 6, further comprising a diode region that surrounds the temperature detection region in plan view,
wherein the switching element region at least partially surrounds the diode region.

9. The semiconductor device according to claim 1, further comprising a diode region provided adjacent to the switching element region,
wherein the temperature detection region is provided to be surrounded by the switching element region.

10. The semiconductor device according to claim 1, further comprising a diode region that surrounds the temperature detection region in plan view,
wherein the switching element region at least partially surrounds the diode region.

11. The semiconductor device according to claim 1, wherein the well layer is directly connected to the anode electrode.

12. The semiconductor device according to claim 1, wherein the cathode layer is directly connected to the cathode electrode.

13. The semiconductor device according to claim 1, wherein the well layer and the cathode layer constitute a Schottky diode.

14. The semiconductor device according to claim 13, wherein a Schottky junction is present between the well layer and the anode electrode.

15. The semiconductor device according to claim 1, wherein the anode electrode and the cathode electrode are provided on a same side of the semiconductor device.

16. The semiconductor device according to claim 1, wherein the signal pad region is provided outside of the temperature detection region and the switching element region in plan view.

* * * * *